(12) United States Patent
Kang

(10) Patent No.: US 12,034,035 B2
(45) Date of Patent: Jul. 9, 2024

(54) CAPACITOR COMPRISING ANTI-FERROELECTRIC LAYERS AND HIGH-K DIELECTRIC LAYERS

(71) Applicant: SK hynix Inc., Gyeonggi-do (KR)

(72) Inventor: Se Hun Kang, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 198 days.

(21) Appl. No.: 17/095,889

(22) Filed: Nov. 12, 2020

(65) Prior Publication Data

US 2021/0359082 A1    Nov. 18, 2021

(30) Foreign Application Priority Data

May 18, 2020 (KR) .................. 10-2020-0059056

(51) Int. Cl.
| | |
|---|---|
| H10B 53/30 | (2023.01) |
| H01L 29/51 | (2006.01) |
| H01L 49/02 | (2006.01) |
| H10B 51/20 | (2023.01) |

(52) U.S. Cl.
CPC .......... H01L 28/56 (2013.01); H01L 29/513 (2013.01); H01L 29/516 (2013.01); H01L 29/517 (2013.01); H10B 53/30 (2023.02); H10B 51/20 (2023.02)

(58) Field of Classification Search
CPC . H01L 27/11507; H01L 28/56; H01L 29/513; H01L 29/516; H01L 29/517
See application file for complete search history.

(56) References Cited

U.S. PATENT DOCUMENTS

| | | | |
|---|---|---|---|
| 10,056,393 B2 | 8/2018 | Schröder et al. | |
| 10,614,868 B2 | 4/2020 | Kittl et al. | |
| 2008/0253160 A1* | 10/2008 | Popp | H01L 27/10823 365/72 |
| 2015/0206951 A1* | 7/2015 | Lin | H01L 21/2686 257/411 |
| 2018/0233573 A1 | 8/2018 | Lin et al. | |
| 2020/0020780 A1* | 1/2020 | Kim | H01L 27/10814 |
| 2020/0035807 A1* | 1/2020 | Chen | H01L 29/40114 |
| 2020/0395460 A1* | 12/2020 | Haratipour | H01L 29/151 |
| 2021/0050372 A1* | 2/2021 | Sharangpani | H01L 27/11597 |
| 2021/0091227 A1* | 3/2021 | Heo | H01L 29/513 |

FOREIGN PATENT DOCUMENTS

| | | |
|---|---|---|
| CN | 110718538 A | 1/2020 |
| CN | 110783397 A | 2/2020 |
| CN | 110970404 A | 4/2020 |

OTHER PUBLICATIONS

Office Action for the Korean Patent Application No. 10-2020-0059056 issued by the Korean Intellectual Property Office on Feb. 23, 2024.
Office Action for the Chinese Patent Application No. 202110491216.2 issued by the Chinese Patent Office on Apr. 30, 2024.

* cited by examiner

*Primary Examiner* — Herve-Louis Y Assouman
*Assistant Examiner* — Christopher M Roland
(74) *Attorney, Agent, or Firm* — IP & T GROUP LLP

(57) ABSTRACT

A semiconductor device includes a first electrode, a second electrode, and a multi-layer stack positioned between the first electrode and the second electrode, the multi-layer stack including at least one anti-ferroelectric layer and at least one high-k dielectric layer.

11 Claims, 42 Drawing Sheets

US 12,034,035 B2

CAPACITOR COMPRISING ANTI-FERROELECTRIC LAYERS AND HIGH-K DIELECTRIC LAYERS

CROSS-REFERENCE TO RELATED APPLICATIONS

The present application claims priority to Korean Patent Application No. 10-2020-0059056, filed on May 18, 2020, which is incorporated herein by reference in its entirety.

BACKGROUND

1. Field

Various embodiments of the present invention relate to a semiconductor device and, more particularly, to a semiconductor device including a capacitor.

2. Description of the Related Art

A recent trend of high integration of semiconductor memories reduces the unit cell area, which leads to a low operation voltage. This calls for a high-k material having a high capacitance and a low leakage current.

Heretofore, zirconium oxide ($ZrO_2$) has been used as high-k material for the dielectric layer of a capacitor, however, zirconium oxide has a limited effect in increasing the capacitance. Therefore, new techniques, materials and or structures are needed to further improve the characteristics of capacitors in highly integrated semiconductor memories.

SUMMARY

Embodiments of the present invention are directed to a semiconductor device including a capacitor having a high dielectric constant, a low leakage current and high capacitance.

In accordance with an embodiment of the present invention, a semiconductor device includes: a first electrode; a second electrode; and a multi-layer stack positioned between the first electrode and the second electrode, the multi-layer stack including at least one anti-ferroelectric layer and at least one high-k dielectric layer.

In accordance with another embodiment of the present invention, a semiconductor device includes: a first electrode; a second electrode; and a multi-layer stack positioned between the first electrode and the second electrode, the multi-layer stack including a negative capacitance ferroelectric material layer and at least one high-k dielectric layer.

These and other features and advantages may become apparent to those with ordinary skill in the art to which the present invention belongs or pertains from the following detailed description and figures.

DETAILED DESCRIPTION

Figure 1:
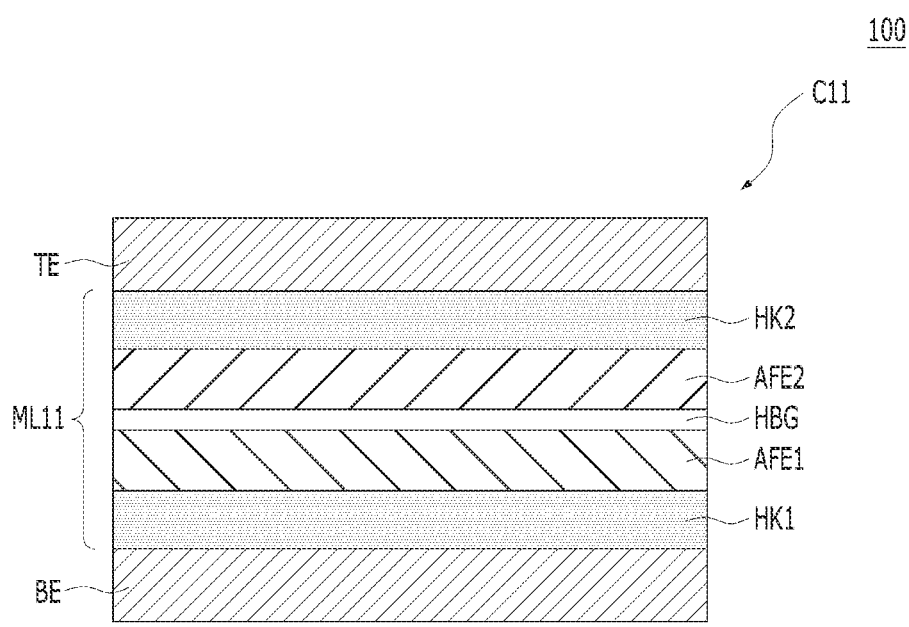
FIG. 1 is a cross-sectional view illustrating a semiconductor device in accordance with an embodiment of the present invention.

Various embodiments of the present invention may be described below in more detail with reference to the accompanying drawings. The present invention may, however, be embodied in different forms and should not be construed as limited to the embodiments set forth herein. Rather, these embodiments are provided so that this disclosure may be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It may be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

It should be understood that the drawings are simplified schematic illustrations of the described devices and may not include well known details in order to avoid obscuring the features of the invention.

It should also be noted that features present in one embodiment may be used with one or more features of another embodiment without departing from the scope of the invention.

Hafnium oxide may exhibit ferroelectric FE. Hafnium zirconium oxide (HfZrO) in which hafnium oxide and zirconium oxide are mixed together may exhibit anti-ferroelectric AFE or ferroelectric FE by adjusting the content of hafnium oxide in the mixture. Hafnium zirconium oxide (HfZrO) may be referred to hereinafter simply as 'HZO'.

TABLE 1

| Ratio of Hafnium Oxide content (x) and zirconium oxide content (y) | 1st Thickness (30 Å < t) | 2nd Thickness (30 Å < t ≤ 50 Å) | 3rd Thickness (t > 50 Å) |
|---|---|---|---|
| x = y | anti-ferroelectric (AFE) | anti-ferroelectric (AFE) | ferroelectric (FE) |
| x > y | anti-ferroelectric (AFE) | ferroelectric (FE) | ferroelectric (FE) |
| x < y | anti-ferroelectric (AFE) | anti-ferroelectric (AFE) | anti-ferroelectric (AFE) |

Table 1 describes the hafnium oxide content (x), the zirconium oxide content (y), and the thickness (t) of the HZO for obtaining anti-ferroelectric AFE or ferroelectric FE.

Referring to Table 1, it can be seen that HZO of a first thickness (30 Å<t) may exhibit anti-ferroelectric AFE regardless of the ratio of the hafnium oxide content (x) and the zirconium oxide content (y). In other words, when the hafnium oxide content (x) and the zirconium oxide content (y) are the same (x=y), when the hafnium oxide content (x) is greater than the zirconium oxide content (y) (x>y), and when the zirconium oxide content (y) is greater than the hafnium oxide content (x), the HZO may exhibit anti-ferroelectric AFE when formed into a layer having a thickness greater than 30 Å.

When the HZO is formed into a layer of a second thickness t that satisfies the inequality 30 Å<t≤50 Å may exhibit anti-ferroelectric AFE when the hafnium oxide content (x) and the zirconium oxide content (y) are the same and when zirconium oxide content (y) is greater than the hafnium oxide content (x). However, when the hafnium oxide content (x) is greater than the zirconium oxide content (y), the HZO may exhibit ferroelectric FE.

When, the HZO is formed int a layer having a third thickness t that satisfies the inequality t>50 Å, then the HZO may exhibit anti-ferroelectric AFE when the zirconium oxide content (y) is greater than the hafnium oxide content (x). However, when the hafnium oxide content (x) and the zirconium oxide content (y) are the same and when the hafnium oxide content (x) is greater than the zirconium oxide content (y), then the HZO may exhibit ferroelectric FE.

As described above, when the hafnium oxide content and the zirconium oxide content are the same, or when the hafnium oxide content is greater than the zirconium oxide content, the anti-ferroelectric AFE and ferroelectric FE of HZO may be selectively controlled by adjusting its thickness. When the zirconium oxide content is greater than the hafnium oxide content, HZO may exhibit anti-ferroelectric AFE regardless of its thickness.

Hereinafter, a hafnium zirconium oxide whose hafnium oxide content and zirconium oxide content are the same may be referred to as a 'base hafnium zirconium oxide (base-HZO, B-HZO)'. A hafnium zirconium oxide whose hafnium oxide content is greater than the zirconium oxide content may be referred to as a 'hafnium oxide-rich hafnium zirconium oxide (hafnium oxide-rich HZO, HR-HZO)'. A hafnium zirconium oxide whose zirconium oxide content is greater than the hafnium oxide content may be referred to as a 'zirconium oxide-rich hafnium zirconium oxide (zirconium oxide-rich HZO, ZR-HZO)'. The hafnium zirconium oxide having ferroelectric may be referred to as a 'ferroelectric hafnium zirconium oxide (ferroelectric-HZO, FE-HZO)', and the hafnium zirconium oxide having anti-ferroelectric may be referred to as 'anti-ferroelectric hafnium zirconium oxide (anti-ferroelectric-HZO, AFE-HZO)'.

The anti-ferroelectric hafnium zirconium oxide AFE-HZO may have a higher dielectric constant than the base hafnium zirconium oxide B-HZO and the ferroelectric hafnium zirconium oxide FE-HZO, and may induce a characteristic that the amount of charges increases in a voltage region where a switching occurs, that is, ultra-high-k characteristics.

Hereinafter, in the embodiments of the present invention, $Hf_xZr_yO$ may refer to a hafnium zirconium oxide in which hafnium oxide and zirconium oxide are mixed with each other. In $Hf_xZr_yO$, 'x' may refer to the hafnium oxide content or the hafnium content, and 'y' may refer to the zirconium oxide content or the zirconium content. A hafnium oxide-rich hafnium zirconium oxide HR-HZO may also be referred to as a hafnium-rich hafnium zirconium oxide. A zirconium oxide-rich hafnium zirconium oxide HR-HZO may also be referred to as a zirconium-rich hafnium zirconium oxide. $Hf_xZr_yO$ may also be represented by $(HfO)_x(ZrO)_y$, wherein HfO represents the hafnium oxide, and ZrO represents the zirconium oxide.

The base hafnium zirconium oxide B-HZO may include $Hf_xZr_yO$ (x=y=0.5). $Hf_xZr_yO$ (x=y=0.5) may refer to a material whose hafnium oxide content (x) and zirconium oxide content (y) are the same. $Hf_xZr_yO$ (x=y=0.5) may exhibit anti-ferroelectric AFE at a thickness of approximately 50 Å or less. When the thickness of $Hf_xZr_yO$ (x=y=0.5) is greater than approximately 50 Å, it may exhibit ferroelectric FE.

A hafnium oxide-rich hafnium zirconium oxide HR-HZO may include $Hf_xZr_yO$ (x>y, 0.5<x<0.9). $Hf_xZr_yO$ (x>y, 0.5<x<0.9) may refer to a material whose hafnium oxide content (x) is greater than the zirconium oxide content (y). $Hf_xZr_yO$ (x>y, 0.5<x<0.9) may exhibit anti-ferroelectric AFE when it is thinner than approximately 30 Å. When $Hf_xZr_yO$ (x>y, 0.5<x<0.9) has a thickness of approximately 30 Å or more, it may exhibit ferroelectric FE.

A zirconium oxide-rich hafnium zirconium oxide (ZR-HZO) may include $Hf_xZr_yO$ (x<y, 0.5<y<0.7). $Hf_xZr_yO$ (x<y, 0.5<y<0.7) may refer to a material whose zirconium oxide content (y) is greater than the hafnium oxide content (x). $Hf_xZr_yO$ (x<y, 0.5<y<0.7) may exhibit anti-ferroelectric AFE not only at a thickness of approximately 30 Å or more but also at a thickness of approximately 30 Å or less. $Hf_xZr_yO$ (x<y, y≥0.7) may exhibit anti-ferroelectric AFE, even when the zirconium oxide content (z) is significantly greater than the hafnium oxide content (x), that is, it may exhibit anti-ferroelectric AFE regardless of the thickness.

According to the above description, HZO may exhibit ferroelectric FE or anti-ferroelectric AFE by controlling at least one parameter among the hafnium oxide content (or hafnium content), the zirconium oxide content (or zirconium content), and the thickness.

FIG. 1 is a cross-sectional view illustrating a semiconductor device 100 in accordance with an embodiment of the present invention.

Referring to FIG. 1, the semiconductor device 100 may include a capacitor C11. The capacitor C11 may include a first electrode BE, a second electrode TE, and a multi-layer stack ML11 between the first electrode BE and the second electrode TE. The multi-layer stack ML11 may include at least one anti-ferroelectric layer AFE1 and AFE2 and at least one high-k dielectric layer HK1 and HK2. The multi-layer stack ML11 may further include at least one high band gap layer HBG.

The multi-layer stack ML11 may include a first high-k dielectric layer HK1, a first anti-ferroelectric layer AFE1, a high band gap layer HBG, a second anti-ferroelectric layer AFE2, and a second high-k dielectric layer HK2 in the mentioned order. The first high-k dielectric layer HK1 may be formed over the first electrode BE, and the first anti-ferroelectric layer AFE1 may be formed over the first high-k dielectric layer HK1. The high band gap layer HBG may be formed over the first anti-ferroelectric layer AFE1, and the second anti-ferroelectric layer AFE2 may be formed over the high band gap layer HBG. The second high-k dielectric layer HK2 may be formed over the second anti-ferroelectric layer AFE2, and the second electrode TE may be formed over the second high-k dielectric layer HK2. The multi-layer stack ML11 may include at least one direct contact interface, where the direct contact interface includes at least one direct contact interface in which at least one anti-ferroelectric layer AFE1 and AFE2 and at least one high-k dielectric layer HK1 and HK2 are in direct contact. For example, the first high-k dielectric layer HK1 and the first anti-ferroelectric layer AFE1 may be in direct contact, or the second anti-ferroelectric layer AFE2 and the second high-k dielectric layer HK2 may be in direct contact. In yet another example the first high-k dielectric layer HK1 and the first anti-ferroelectric layer AFE1 may be in direct contact, and the second anti-ferroelectric layer AFE2 and the second high-k dielectric layer HK2 may be in direct contact.

The first anti-ferroelectric layer AFE1 may be made of or include hafnium (Hf), zirconium (Zr), and oxygen (O). The first anti-ferroelectric layer AFE1 may include an anti-ferroelectric hafnium zirconium oxide AFE-HZO. As the first anti-ferroelectric layer AFE1, the anti-ferroelectric hafnium zirconium oxide AFE-HZO may include at least one of a base hafnium zirconium oxide B-HZO, a hafnium oxide-rich hafnium zirconium oxide HR-HZO or a zirconium oxide-rich hafnium zirconium oxide (ZR-HZO). According to the embodiment of the present invention, the first anti-ferroelectric layer AFE1 may include an anti-ferroelectric hafnium zirconium oxide AFE-HZO having a thickness of approximately 50 Å or less (5 to 50 Å). For example, the first anti-ferroelectric layer AFE1 may include $Hf_xZr_yO$ (x=y) whose hafnium oxide content (x) and zirconium oxide content (y) are the same. In this case, the thickness may be approximately 50 Å or less. According to another embodiment of the present invention, the first anti-ferroelectric layer AFE1 may include $Hf_xZr_yO$ (x>y) whose hafnium oxide content (x) is greater than the zirconium oxide content (y). In this case, the thickness may be less than approximately 30 Å. According to another embodiment of the present invention, the first anti-ferroelectric layer AFE1 may include $Hf_xZr_yO$ (y>x) whose zirconium oxide content (y) is greater than the hafnium oxide content (x). In this case, the thickness may be approximately 50 Å or less.

The second anti-ferroelectric layer AFE2 may be made of or include hafnium (Hf), zirconium (Zr), and oxygen (O). The second anti-ferroelectric layer AFE2 may include an anti-ferroelectric hafnium zirconium oxide AFE-HZO. As a second anti-ferroelectric layer AFE2, anti-ferroelectric hafnium zirconium oxide AFE-HZO may include a base hafnium zirconium oxide B-HZO, a hafnium oxide-rich hafnium zirconium oxide HR-HZO, or a zirconium oxide-rich hafnium zirconium oxide (ZR-HZO). According to the embodiment of the present invention, the second anti-ferroelectric layer AFE2 may include an anti-ferroelectric hafnium zirconium oxide AFE-HZO having a thickness of approximately 50 Å or less (5 to 50 Å). For example, the second anti-ferroelectric layer AFE2 may include $Hf_xZr_yO$ (x=y) whose hafnium oxide content (x) and zirconium oxide content (y) are the same. In this case, the thickness may be approximately 50 Å or less. According to another embodiment of the present invention, the second anti-ferroelectric layer AFE2 may include $Hf_xZr_yO$ (x>y) whose hafnium oxide content (x) is greater than the zirconium oxide content (y). In this case, the thickness may be less than approximately 30 Å. According to another embodiment of the present invention, the second anti-ferroelectric layer AFE2 may include $Hf_xZr_yO$ (y>x) whose zirconium oxide content (y) is greater than the hafnium oxide content (x). In this case, the thickness may be approximately 50 Å or less.

The first and second anti-ferroelectric layers AFE1 and AFE2 may each be anti-ferroelectric hafnium zirconium oxides AFE-HZO of the same type material or same material. For example, the first and second anti-ferroelectric layers AFE1 and AFE2 may each be a base hafnium zirconium oxide B-HZO of approximately 50 Å or less. Also, the first and second anti-ferroelectric layers AFE1 and AFE2 may each be a hafnium oxide-rich hafnium zirconium oxide HR-HZO which is thinner than approximately 30 Å.

According to another embodiment of the present invention, the first and second anti-ferroelectric layers AFE1 and AFE2 may each be anti-ferroelectric hafnium zirconium oxides AFE-HZO of different materials. For example, the first anti-ferroelectric layer AFE1 may be a base hafnium zirconium oxide B-HZO of approximately 50 Å or less, and the second anti-ferroelectric layer AFE2 may be a hafnium oxide-rich hafnium zirconium oxide HR-HZO which is thinner than approximately 30 Å. Also, the first anti-ferroelectric layer AFE1 may be a hafnium oxide-rich hafnium zirconium oxide HR-HZO which is thinner than approximately 30 Å, and the second anti-ferroelectric layer AFE2 may be a base hafnium zirconium oxide B-HZO of approximately 50 Å or less.

According to another embodiment of the present invention, the first and second anti-ferroelectric layers AFE1 and AFE2 may each include different anti-ferroelectric hafnium zirconium oxides and may have the same thickness or different thicknesses.

According to another embodiment of the present invention, the first and second anti-ferroelectric layers AFE1 and AFE2 may each include the same anti-ferroelectric hafnium zirconium oxide AFE-HZO. Herein, the first anti-ferroelectric layer AFE1 and the second anti-ferroelectric layer AFE2 may have the same thickness or different thicknesses. For example, the first and second anti-ferroelectric layers AFE1 and AFE2 may each be a hafnium oxide-rich hafnium zirconium oxide HR-HZO which is thinner than approximately 30 Å. The first anti-ferroelectric layer AFE1 may be a base hafnium zirconium oxide B-HZO of approximately 50 Å or less, and the second anti-ferroelectric layer AFE2 may be a base hafnium zirconium oxide B-HZO which is thinner than approximately 30 Å.

According to another embodiment of the present invention, the first and second anti-ferroelectric layers AFE1 and AFE2 may each be anti-ferroelectric hafnium zirconium oxides having the same hafnium oxide content. For example, the first anti-ferroelectric layer AFE1 may include a first hafnium oxide-rich hafnium zirconium oxide HR-HZO, and the second anti-ferroelectric layer AFE1 and AFE2 may include a second hafnium oxide-rich hafnium zirconium oxide HR-HZO. Herein, the first hafnium oxide-rich hafnium zirconium oxide HR-HZO and the second hafnium oxide-rich hafnium zirconium oxide HR-HZO may have the same hafnium oxide content.

According to another embodiment of the present invention, the first and second anti-ferroelectric layers AFE1 and AFE2 may each be anti-ferroelectric hafnium zirconium oxides having different hafnium oxide contents. For example, the first anti-ferroelectric layer AFE1 may include a first hafnium oxide-rich hafnium zirconium oxide HR-HZO, whereas the second anti-ferroelectric layer AFE1 and AFE2 may include a second hafnium oxide-rich hafnium zirconium oxide HR-HZO. Herein, the first hafnium oxide-rich hafnium zirconium oxide HR-HZO and the second hafnium oxide-rich hafnium zirconium oxide HR-HZO may have different hafnium oxide contents. The hafnium oxide content of the first hafnium oxide-rich hafnium zirconium oxide HR-HZO may be greater than the hafnium oxide content of the second hafnium oxide-rich hafnium zirconium oxide HR-HZO. The hafnium oxide content of the second hafnium oxide-rich hafnium zirconium oxide HR-HZO may be greater than the hafnium oxide content of the first hafnium oxide-rich hafnium zirconium oxide HR-HZO.

The high band gap layer HBG may serve to suppress the leakage current of the multi-layer stack ML11. The high band gap layer HBG may be made of or include a high energy band gap material. The high band gap layer HBG may include a material having a greater energy band gap (which is, hereinafter, referred to as 'band gap') than the first and second anti-ferroelectric layers AFE1 and AFE2. The high band gap layer HBG may be made of a material different from those of the first and second anti-ferroelectric layers AFE1 and AFE2. The high band gap layer HBG may be made of or include a high-k material, and may have a lower dielectric constant than the first and second anti-ferroelectric layers AFE1 and AFE2. The high band gap layer HBG may have a higher dielectric constant than silicon oxide and silicon nitride. The high band gap layer HBG may be made of or include an aluminum-containing material or a beryllium-containing material. The high band gap layer HBG may be made of or include aluminum oxide or beryllium oxide. The high band gap layer HBG may be thinner than each of the first and second anti-ferroelectric layers AFE1 and AFE2. According to another embodiment of the present invention, the high band gap layer HBG may be made of or include aluminum-doped zirconium oxide, aluminum-doped hafnium oxide, beryllium-doped zirconium oxide, or beryllium-doped hafnium oxide.

The first and second anti-ferroelectric layers AFE1 and AFE2 may have higher dielectric constants than the first and second high-k dielectric layers HK1 and HK2. The first high-k dielectric layer HK1 may improve the crystallinity of the first anti-ferroelectric layer AFE1, and the first high-k dielectric layer HK1 may serve to control an incomplete switching region of the interface between the first anti-ferroelectric layer AFE1 and the first electrode BE. The second high-k dielectric layer HK2 may improve the crystallinity of the second anti-ferroelectric layer AFE2, and also serve to control an incomplete switching region of the interface between the second anti-ferroelectric layer AFE2 and the second electrode TE.

The first high-k dielectric layer HK1 may include at least one of hafnium and zirconium. The first high-k dielectric layer HK1 may be made of or include hafnium oxide or zirconium oxide. The first high-k dielectric layer HK1 may be made of a single layer of hafnium oxide or a single layer of zirconium oxide. The bottom portion of the first high-k dielectric layer HK1 may directly contact the first electrode AFE1, and the top portion of the first high-k dielectric layer HK1 may directly contact the first anti-ferroelectric layer AFE1. According to another embodiment of the present invention, another material may be further formed between the first high-k dielectric layer HK1 and the first electrode BE.

The second high-k dielectric layer HK2 may include at least one of hafnium and zirconium. The second high-k dielectric layer HK2 may be made of or include hafnium oxide or zirconium oxide. The second high-k dielectric layer HK2 may be made of a single layer of hafnium oxide or a single layer of zirconium oxide. The bottom portion of the second high-k dielectric layer HK2 may directly contact the second anti-ferroelectric layer AFE2, and the top portion of the second high-k dielectric layer HK2 may directly contact the second electrode TE. According to another embodiment of the present invention, another material may be further formed between the second high-k dielectric layer HK2 and the second electrode TE.

The first high-k dielectric layer HK1 and the second high-k dielectric layer HK2 may be the same material. For example, each of the first high-k dielectric layer HK1 and the second high-k dielectric layer HK2 may be made of a single layer of hafnium oxide. Also, the first high-k dielectric layer HK1 and the second high-k dielectric layer HK2 may each be a single layer of zirconium oxide.

The first high-k dielectric layer HK1 and the second high-k dielectric layer HK2 may be different materials. For example, the first high-k dielectric layer HK1 may be made of a single layer of hafnium oxide, and the second high-k dielectric layer HK2 may be made of a single layer of zirconium oxide. Also, the first high-k dielectric layer HK1 may be made of a single layer of zirconium oxide, and the second high-k dielectric layer HK2 may be made of a single layer of hafnium oxide.

Either the first high-k dielectric layer HK1 or the second high-k dielectric layer HK2 may be an anti-ferroelectric material. For example, the first high-k dielectric layer HK1 may include a zirconium oxide-rich hafnium zirconium oxide (ZR-HZO), and the second high-k dielectric layer HK2 may be hafnium oxide or zirconium oxide. According to another embodiment of the present invention, the first high-k dielectric layer HK1 may be hafnium oxide or zirconium oxide, and the second high-k dielectric layer HK2 may include a zirconium oxide-rich hafnium zirconium oxide (ZR-HZO). The zirconium oxide-rich hafnium zirconium oxide (ZR-HZO) may include $Hf_xZr_yO$ (x<y), for example, $Hf_{0.3}Zr_{0.7}O$.

The first and second high-k dielectric layers HK1 and HK2 may be thicker than the first and second anti-ferroelectric layers AFE1 and AFE2. The first and second high-k dielectric layers HK1 and HK2 may have the same thickness as those of the first and second anti-ferroelectric layers AFE1 and AFE2.

As described above, the first high-k dielectric layer HK1, the first anti-ferroelectric layer AFE1, the second anti-ferroelectric layer AFE2, and the second high-k dielectric layer HK2 may be made of or include a high-k material, and the high band gap layer HBG may include a material having a higher band gap than the first high-k dielectric layer HK1, the first anti-ferroelectric layer AFE1, the second anti-ferroelectric layer AFE2, and the second high-k dielectric layer HK2. The first anti-ferroelectric layer AFE1 and the second anti-ferroelectric layer AFE2 may have higher dielectric constants than the first high-k dielectric layer HK1 and the second high-k dielectric layer HK2.

The first and second high-k dielectric layers HK1 and HK2 may each include hafnium or zirconium, and the first and second anti-ferroelectric layers AFE1 and AFE2 may each include hafnium and zirconium. The first high-k dielectric layer HK1 and the second high-k dielectric layer HK2 may be hafnium oxides or zirconium oxides, and the first anti-ferroelectric layer AFE1 and second anti-ferroelectric layer AFE2 may be anti-ferroelectric hafnium zirconium oxides. The first high-k dielectric layer HK1 and the second high-k dielectric layer HK2 may be ferroelectric hafnium oxides, and the first and second anti-ferroelectric layers AFE1 and AFE2 may each be anti-ferroelectric hafnium zirconium oxides.

According to some embodiments of the present invention, the multi-layer stack ML11 may include an $HfO_2$/AFE-HZO/$Al_2O_3$/AFE-HZO/$HfO_2$ stack. The $HfO_2$/AFE-HZO/$Al_2O_3$/AFE-HZO/$HfO_2$ stack may include a first hafnium oxide layer ($HfO_2$), a first anti-ferroelectric hafnium zirconium oxide layer AFE-HZO, an aluminum oxide layer ($Al_2O_3$), a second anti-ferroelectric hafnium zirconium oxide layer AFE-HZO, and a second hafnium oxide layer ($HfO_2$) that are stacked in the mentioned order. The first hafnium oxide layer ($HfO_2$) may correspond to the first high-k dielectric layer HK1, and the second hafnium oxide layer ($HfO_2$) may correspond to the second high-k dielectric layer HK2. The aluminum oxide layer ($Al_2O_3$) may correspond to the high band gap layer HBG. The first anti-ferroelectric hafnium zirconium oxide layer AFE-HZO may correspond to the first anti-ferroelectric layer AFE1, and the second anti-ferroelectric hafnium zirconium oxide layer AFE-HZO may be the second anti-ferroelectric layer AFE2.

According to some embodiments of the present invention, the multi-layer stack ML11 may include a $ZrO_2$/AFE-HZO/$Al_2O_3$/AFE-HZO/$ZrO_2$ stack. The $ZrO_2$/AFE-HZO/$Al_2O_3$/AFE-HZO/$ZrO_2$ stack may include a first zirconium oxide layer ($ZrO_2$), a first anti-ferroelectric hafnium zirconium oxide layer AFE-HZO, an aluminum oxide layer ($Al_2O_3$), a second anti-ferroelectric hafnium zirconium oxide layer AFE-HZO, and the second zirconium oxide layer ($ZrO_2$) that are stacked in the mentioned order. The first zirconium oxide layer ($ZrO_2$) may correspond to the first high-k dielectric layer HK1, and the second zirconium oxide layer ($ZrO_2$) may correspond to the second high-k dielectric layer HK2. The aluminum oxide layer ($Al_2O_3$) may correspond to the high band gap layer HBG. The first anti-ferroelectric hafnium zirconium oxide layer AFE-HZO may correspond to the first anti-ferroelectric layer AFE1, and the second anti-ferroelectric hafnium zirconium oxide layer AFE-HZO may correspond to the second anti-ferroelectric layer AFE2.

According to some embodiments of the present invention, the multi-layer stack ML11 may include a $ZrO_2$/AFE-HZO/Al-doped $ZrO_2$/AFE-HZO/$ZrO_2$ stack, an $HfO_2$/AFE-HZO/Al-doped $HfO_2$/AFE-HZO/$HfO_2$ stack, a $ZrO_2$/AFE-HZO/$Al_2O_3$/AFE-HZO/$HfO_2$ stack, or an $HfO_2$/AFE-HZO/$Al_2O_3$/AFE-HZO/$ZrO_2$ stack.

The first high-k dielectric layer HK1, the first anti-ferroelectric layer AFE1, the high band gap layer HBG, the second anti-ferroelectric layer AFE2, and the second high-k dielectric layer HK2 may be formed by atomic layer deposition (ALD).

The high band gap layer HBG may have a thickness of approximately 10 Å or less (1 to 10 Å), and the first anti-ferroelectric layer AFE1 and the second anti-ferroelectric layer AFE2 may have a thickness of approximately 50 Å or less (5 to 50 Å). The first high-k dielectric layer HK1 and the second high-k dielectric layer HK2 may have a thickness of approximately 50 Å or less (5 to 50 Å). The first and second high-k dielectric layers HK1 and HK2 and the first and second anti-ferroelectric layers AFE1 and AFE2 may have the same thickness or different thicknesses.

Figure 2:
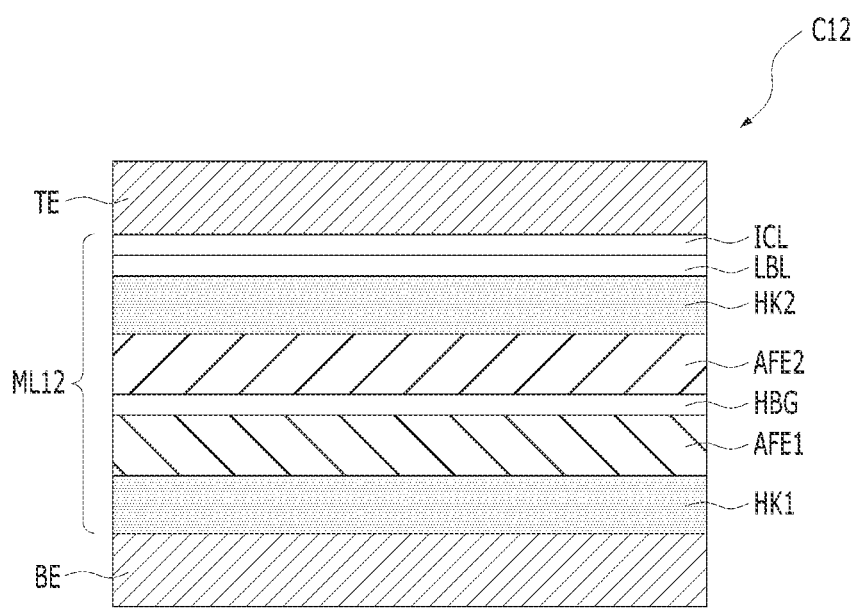
FIG. 2 is a cross-sectional view illustrating a capacitor according to a modified example of FIG. 1.

FIG. 2 is a cross-sectional view illustrating a capacitor C12 according to a modified example of FIG. 1.

Referring to FIG. 2, the capacitor C12 may be similar to the capacitor C11 of FIG. 1. Hereinafter, detailed description on the constituent elements that also appear in FIG. 1 may be omitted.

The capacitor C12 may include a first electrode BE, a second electrode TE, and a multi-layer stack ML12 positioned between the first electrode BE and the second electrode TE. The multi-layer stack ML12 may include at least one anti-ferroelectric layer AFE1 and AFE2 and at least one high-k dielectric layer HK1 and HK2. The multi-layer stack ML12 may further include at least one high band gap layer HBG. The multi-layer stack ML12 may further include a leakage blocking layer LBL and an interface control layer ICL.

The multi-layer stack ML12 may include a first high-k dielectric layer HK1, a first anti-ferroelectric layer AFE1, a high band gap layer HBG, a second anti-ferroelectric layer AFE2, a second high-k dielectric layer HK2, a leakage blocking layer LBL, and an interface control layer ICL that are stacked in the mentioned order.

The leakage blocking layer LBL and the interface control layer ICL may be positioned between the second high-k dielectric layer HK2 and the second electrode TE. The leakage blocking layer LBL may be positioned between the second high-k dielectric layer HK2 and the interface control layer ICL. The interface control layer ICL may be positioned between the leakage blocking layer LBL and the second electrode TE.

Suitable materials for the leakage blocking layer LBL may include a high band gap material having a high energy band gap. The leakage blocking layer LBL may include a material having a greater energy band gap than the first high-k dielectric layer HK1, the first anti-ferroelectric layer AFE1, the second anti-ferroelectric layer AFE2, and the second high-k dielectric layer HK2. The leakage blocking layer LBL may contain a high-k material, and it may have a lower dielectric constant than the first high-k dielectric layer HK1, the first anti-ferroelectric layer AFE1, the second anti-ferroelectric layer AFE2, and the second high-k dielectric layer HK2. The leakage blocking layer LBL may have a higher dielectric constant than silicon oxide and silicon nitride. The leakage blocking layer LBL may be made of or include aluminum oxide or beryllium oxide. The leakage blocking layer LBL may be formed by atomic layer deposition (ALD). The leakage blocking layer LBL may be thinner than each of the first high-k dielectric layer HK1, the first anti-ferroelectric layer AFE1, the second anti-ferroelectric layer AFE2, and the second high-k dielectric layer HK2. Since the leakage blocking layer LBL and the high band gap layer HBG have relatively lower dielectric constants than the first high-k dielectric layer HK1, the first anti-ferroelectric layer AFE1, the second anti-ferroelectric layer AFE2, and the second high-k dielectric layer HK2, in order to increase the capacitance of the capacitor C12, the leakage blocking layer LBL and the high band gap layer HBG may be thinner than each of the first high-k dielectric layer HK1, the first anti-ferroelectric layer AFE1, the second anti-ferroelectric layer AFE2, and the second high-k dielectric layer HK2. The leakage blocking layer LBL and the high band gap layer HBG may each have a thickness of approximately 10 Å or less. The leakage blocking layer LBL and the high band gap layer HBG may have the same thickness. The leakage blocking layer LBL and the high band gap layer HBG may have different thicknesses. The leakage blocking layer LBL may be thicker than the high band gap layer HBG.

According to another embodiment of the present invention, the leakage blocking layer LBL and the high band gap layer HBG may be formed of the same type material or same material. For example, the leakage blocking layer LBL may be made of or include aluminum-doped zirconium oxide or beryllium-doped zirconium oxide.

The interface control layer ICL may serve to protect the first high-k dielectric layer HK1, the first anti-ferroelectric layer AFE1, the high band gap layer HBG, the second anti-ferroelectric layer AFE2, and the second high-k dielectric layer HK2, when the second electrode TE is formed. Also, the interface control layer ICL may reduce the leakage current of the multi-layer stack ML12.

The interface control layer ICL may be made of a material that is reduced prior to the first high-k dielectric layer HK1, the first anti-ferroelectric layer AFE1, the second anti-ferroelectric layer AFE2, and the second high-k dielectric layer HK2, when the second electrode TE is deposited. The interface control layer ICL may serve as a leakage current barrier having a large effective work function (eWF) and a large conduction band offset (CBO). Also, the interface control layer ICL may not increase the equivalent oxide film thickness $T_{ox}$ of the multi-layer stack ML12.

The interface control layer ICL may be made of a material having a high electronegativity. The interface control layer ICL may have a higher Pauling electronegativity than the first high-k dielectric layer HK1, the first anti-ferroelectric layer AFE1, the second anti-ferroelectric layer AFE2, and the second high-k dielectric layer HK2. The interface control layer ICL may include a material having a high Pauling electronegativity, which is simply referred to as electronegativity, hereinafter, compared to the first high-k dielectric layer HK1, the first anti-ferroelectric layer AFE1, the second anti-ferroelectric layer AFE2, and the second high-k dielectric layer HK2. When the electronegativity is high, it is difficult to be oxidized and easy to be reduced. Accordingly, the interface control layer ICL may deprive oxygen instead of the first high-k dielectric layer HK1, the first anti-ferroelectric layer AFE1, the second anti-ferroelectric layer AFE2, and the second high-k dielectric layer HK2. The interface control layer ICL may prevent oxygen loss of the first high-k dielectric layer HK1, the first anti-ferroelectric layer AFE1, the second anti-ferroelectric layer AFE2, and the second high-k dielectric layer HK2.

The interface control layer ICL may include atoms having high electronegativity, for example, metal atoms, silicon atoms, or germanium atoms. The interface control layer ICL may be made of or include titanium (Ti), tantalum (Ta), aluminum (Al), tin (Sn), molybdenum (Mo), ruthenium (Ru), iridium (Ir), niobium (Nb), germanium (Ge), silicon (Si), nickel (Ni), or a combination thereof. The interface control layer ICL may include a stack of molybdenum and molybdenum nitride (Mo/MoN) or a stack of tungsten and tungsten nitride (W/WN). The interface control layer ICL may include a conductive material containing atoms having a high electronegativity, and accordingly, the interface control layer ICL may serve as a part of the second electrode TE.

The interface control layer ICL may be made of or include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide, or a combination thereof.

According to some embodiments of the present invention, the multi-layer stack ML12 may include an $HfO_2$/AFE-HZO/$Al_2O_3$/AFE-HZO/$HfO_2$/$Al_2O_3$/$TiO_2$ stack. The $HfO_2$/AFE-HZO/$Al_2O_3$/AFE-HZO/$HfO_2$/$Al_2O_3$/$TiO_2$ stack may include a first hafnium oxide layer ($HfO_2$), a first anti-ferroelectric hafnium zirconium oxide layer AFE-HZO, a first aluminum oxide layer ($Al_2O_3$), a second anti-ferroelectric hafnium zirconium oxide layer AFE-HZO, a second hafnium oxide layer ($HfO_2$), a second aluminum oxide layer ($Al_2O_3$), and a titanium oxide layer ($TiO_2$) that are stacked in the mentioned order. The first hafnium oxide layer ($HfO_2$) may correspond to the first high-k dielectric layer HK1, and the second hafnium oxide layer ($HfO_2$) may correspond to the second high-k dielectric layer HK2. The aluminum oxide layer ($Al_2O_3$) may correspond to the high band gap layer HBG. The first anti-ferroelectric hafnium zirconium oxide layer AFE-HZO may correspond to the first anti-ferroelectric layer AFE1, and the second anti-ferroelectric hafnium zirconium oxide layer AFE-HZO may correspond to the second anti-ferroelectric layer AFE2. The second aluminum oxide layer ($Al_2O_3$) may correspond to the leakage blocking layer LBL, and the titanium oxide layer ($TiO_2$) may correspond to the interface control layer ICL.

According to some embodiments of the present invention, the multi-layer stack ML12 may include a $ZrO_2$/AFE-HZO/$Al_2O_3$/AFE-HZO/$ZrO_2$/$Al_2O_3$/$TiO_2$ stack. The $ZrO_2$/AFE-HZO/$Al_2O_3$/AFE-HZO/$ZrO_2$/$Al_2O_3$/$TiO_2$ stack may include a first zirconium oxide layer ($ZrO_2$), a first anti-ferroelectric hafnium zirconium oxide layer AFE-HZO, an aluminum oxide layer ($Al_2O_3$), a second anti-ferroelectric hafnium zirconium oxide layer AFE-HZO, a second zirconium oxide layer ($ZrO_2$), a second aluminum oxide layer ($Al_2O_3$), and a titanium oxide layer ($TiO_2$) that are stacked in the mentioned order. The first zirconium oxide layer ($ZrO_2$) may correspond to the first high-k dielectric layer HK1, and the second zirconium oxide layer ($ZrO_2$) may correspond to the second high-k dielectric layer HK2. The aluminum oxide layer ($Al_2O_3$) may correspond to the high band gap layer HBG. The first anti-ferroelectric hafnium zirconium oxide layer AFE-HZO may correspond to the first anti-ferroelectric layer AFE1, and the second anti-ferroelectric hafnium zirconium oxide layer AFE-HZO may correspond to the second anti-ferroelectric layer AFE2. The second aluminum oxide layer ($Al_2O_3$) may correspond to the leakage blocking layer LBL, and the titanium oxide layer ($TiO_2$) may correspond to the interface control layer ICL.

According to some embodiments of the present invention, the multi-layer stack ML12 may include a $ZrO_2$/AFE-HZO/Al-doped $ZrO_2$/AFE-HZO/$ZrO_2$/$Al_2O_3$/$TiO_2$ stack, a $HfO_2$/AFE-HZO/Al-doped $HfO_2$/AFE-HZO/$HfO_2$/$Al_2O_3$/$TiO_2$ stack, a $ZrO_2$/AFE-HZO/$Al_2O_3$/AFE-HZO/$HfO_2$/$Al_2O_3$/$TiO_2$ stack or a $HfO_2$/AFE-HZO/$Al_2O_3$/AFE-HZO/$ZrO_2$/$Al_2O_3$/$TiO_2$ stack. The aluminum oxide layer ($Al_2O_3$), the aluminum-doped zirconium oxide layer (Al-doped $ZrO_2$), and the aluminum-doped hafnium oxide layer (Al-doped $HfO_2$) may correspond to the high band gap layer HBG.

Figure 3:
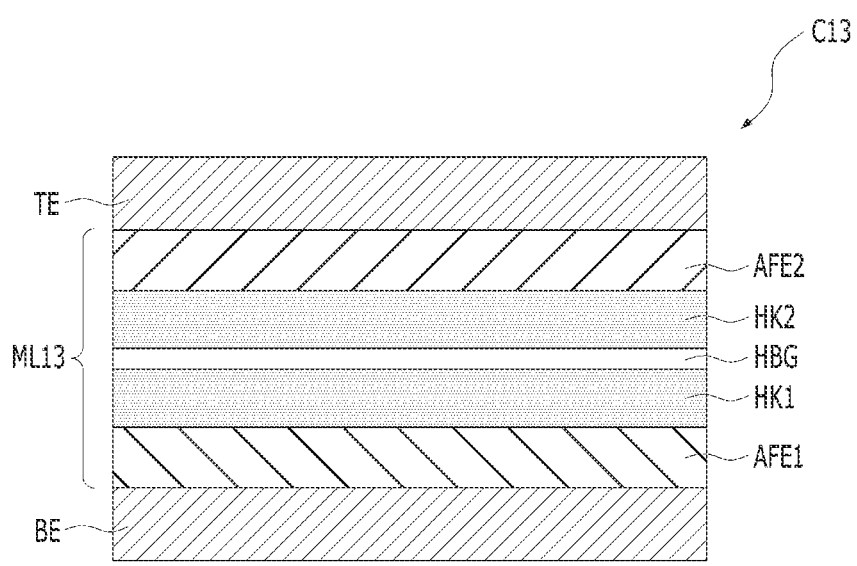
FIG. 3 is a cross-sectional view illustrating a capacitor in accordance with another embodiment of the present invention.

FIG. 3 is a cross-sectional view illustrating a capacitor C13 in accordance with another embodiment of the present invention.

Referring to FIG. 3, the capacitor C13 may be similar to the capacitor C11 of FIG. 1. Hereinafter, detailed description on the constituent elements that also appear in FIG. 1 may be omitted.

The capacitor C13 may include a first electrode BE, a second electrode TE, and a multi-layer stack ML13 positioned between the first electrode BE and the second electrode TE. The multi-layer stack ML13 may include at least one anti-ferroelectric layer AFE1 and AFE2 and at least one high-k dielectric layer HK1 and HK2. The multi-layer stack ML13 may further include at least one high band gap layer HBG.

The multi-layer stack ML13 may include a first anti-ferroelectric layer AFE1, a first high-k dielectric layer HK1, a high band gap layer HBG, a second high-k dielectric layer HK2, and a second anti-ferroelectric layer AFE2 that are stacked in the mentioned order.

The first anti-ferroelectric layer AFE1 may directly contact the first electrode BE and the first high-k dielectric layer HK1. The first anti-ferroelectric layer AFE1 may be positioned between the first electrode BE and the first high-k dielectric layer HK1. The second anti-ferroelectric layer AFE2 may directly contact the second electrode TE and the second high-k dielectric layer HK2. The second anti-ferroelectric layer AFE2 may be positioned between the second electrode TE and the second high-k dielectric layer HK2.

The high band gap layer HBG may be positioned between the first high-k dielectric layer HK1 and the second high-k dielectric layer HK2. The high band gap layer HBG may directly contact the first high-k dielectric layer HK1 and the second high-k dielectric layer HK2. Referring back to FIG. 1, the high band gap layer HBG of the capacitor C11 may be positioned between the first anti-ferroelectric layer AFE1 and the second anti-ferroelectric layer AFE2.

The high band gap layer HBG may be made of or include a high band gap material having a large energy band gap. The high band gap layer HBG may include a material having a greater energy band gap than the first and second high-k dielectric layers HK1 and HK2. The high band gap layer HBG may be made of a material different from those of the first and second high-k dielectric layers HK1 and HK2. The high band gap layer HBG may be made of or include a high-k material, but may have a smaller dielectric constant than the first and second high-k dielectric layers HK1 and HK2. The high band gap layer HBG may have a greater dielectric constant than silicon oxide and silicon nitride. The high band gap layer HBG may be made of or include an aluminum-containing material or a beryllium-containing material. The high band gap layer HBG may be made of or include aluminum oxide or beryllium oxide. The high band gap layer HBG may be thinner than each of the first and second high-k dielectric layers HK1 and HK2.

According to another embodiment of the present invention, the high band gap layer HBG may not separate grains of the first high-k dielectric layer HK1 and the second high-k dielectric layer HK2. For example, the grains of the first high-k dielectric layer HK1, the high band gap layer HBG, and the second high-k dielectric layer HK2 may be continuous without being separated. The high band gap layer HBG may have a thin thickness that does not separate the grains of the first high-k dielectric layer HK1 and the grains of the second high-k dielectric layer HK2. Accordingly, the grains of the first high-k dielectric layer HK1 and the grains of the second high-k dielectric layer HK2 may be vertically continuous.

When the first high-k dielectric layer HK1 and the second high-k dielectric layer HK2 include zirconium oxide, the high band gap layer HBG may be aluminum-doped zirconium oxide or beryllium-doped zirconium oxide. When the first high-k dielectric layer HK1 and the second high-k dielectric layer HK2 contain hafnium oxide, the high band gap layer HBG may be aluminum-doped hafnium oxide or beryllium-doped hafnium oxide. The high band gap layer HBG, the first high-k dielectric layer HK1, and the second high-k dielectric layer HK2 may all have a tetragonal crystal structure.

FIGS. 4A to 4E are cross-sectional views illustrating a capacitor according to modified examples of FIG. 3.

Figure 4A:
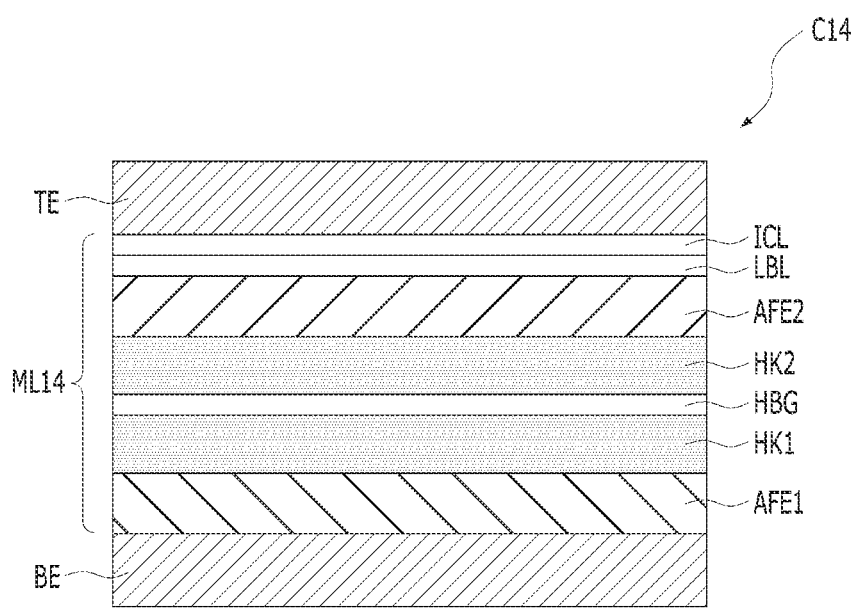
FIGS. 4A to 4E are cross-sectional views illustrating a capacitor according to modified examples of FIG. 3.

Referring to FIG. 4A, the capacitor C14 may be similar to the capacitor C13 of FIG. 3. Hereinafter, detailed description on the constituent elements that also appear in FIG. 3 may be omitted.

The capacitor C14 may include a first electrode BE, a second electrode TE, and a multi-layer stack ML14 positioned between the first electrode BE and the second electrode TE. The multi-layer stack ML14 may include at least one anti-ferroelectric layer AFE1 and AFE2 and at least one high-k dielectric layer HK1 and HK2. The multi-layer stack ML14 may further include at least one high band gap layer HBG. The multi-layer stack ML14 may further include a leakage blocking layer LBL and an interface control layer ICL.

The multi-layer stack ML14 may include a first anti-ferroelectric layer AFE1, a first high-k dielectric layer HK1, a high band gap layer HBG, a second high-k dielectric layer HK2, a second anti-ferroelectric layer AFE2, a leakage blocking layer LBL, and an interface control layer ICL that are stacked in the mentioned order.

The leakage blocking layer LBL and the interface control layer ICL may be positioned between the second anti-ferroelectric layer AFE2 and the second electrode TE. The leakage blocking layer LBL may be positioned between the second anti-ferroelectric layer AFE and the interface control layer ICL. The interface control layer ICL may be positioned between the leakage blocking layer LBL and the second electrode TE. As for the detailed description on the leakage blocking layer LBL and the interface control layer ICL, FIG. 2 and the accompanying description may be referred to.

An application example of the multi-layer stack ML14 may be described as follows.

Figure 4B:
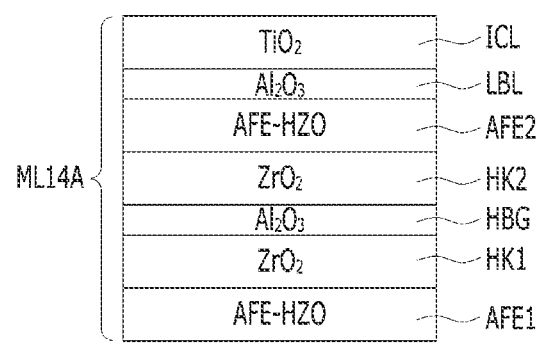

Referring to FIG. 4B, the multi-layer stack ML14A may include an AFE-HZO/$ZrO_2$/$Al_2O_3$/$ZrO_2$/AFE-HZO/$Al_2O_3$/ $TiO_2$ stack. The first and second anti-ferroelectric layers AFE1 and AFE2 may each include anti-ferroelectric hafnium zirconium oxide AFE-HZO. The first and second high-k dielectric layers HK1 and HK2 may each include zirconium oxide ($ZrO_2$). The high band gap layer HBG may be made of or include aluminum oxide ($Al_2O_3$). The leakage blocking layer LBL may be made of or include aluminum oxide ($Al_2O_3$), and the interface control layer ICL may be made of or include titanium oxide ($TiO_2$).

Therefore, the multi-layer stack ML14A may be made of or include-ferroelectric hafnium zirconium oxide AFE-HZO, zirconium oxide ($ZrO_2$), aluminum oxide ($Al_2O_3$), zirconium oxide ($ZrO_2$), anti-ferroelectric hafnium zirconium oxide AFE-HZO, aluminum oxide ($Al_2O_3$), and titanium oxide ($TiO_2$) that are stacked in the mentioned order.

Figure 4C:
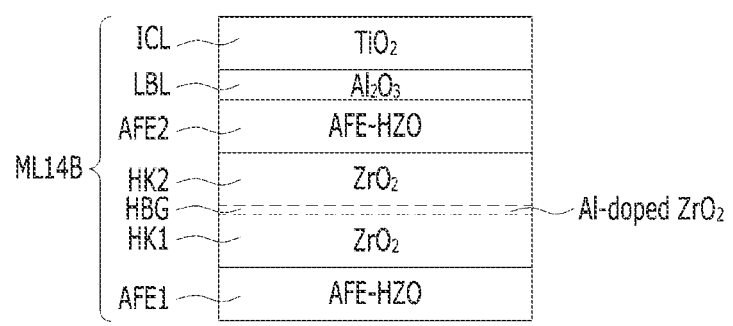

Referring to FIG. 4C, the multi-layer stack ML14B may include an AFE-HZO/$ZrO_2$/Al-doped $ZrO_2$/$ZrO_2$/AFE- HZO/Al$_2$O$_3$/TiO$_2$ stack. The first and second anti-ferroelectric layers AFE1 and AFE2 may each include anti-ferroelectric hafnium zirconium oxide AFE-HZO. The first and second high-k dielectric layers HK1 and HK2 may each include zirconium oxide (ZrO$_2$). The high band gap layer HBG may be made of or include aluminum-doped zirconium oxide (Al-doped ZrO$_2$). The leakage blocking layer LBL may be made of or include aluminum oxide (Al$_2$O$_3$), and the interface control layer ICL may be made of or include titanium oxide (TiO$_2$). In ZrO$_2$/Al-doped ZrO$_2$/ZrO$_2$, aluminum-doped zirconium oxide (Al-doped ZrO$_2$) may not separate the grains of zirconium oxides (ZrO$_2$).

Therefore, the multi-layer stack ML14B may be made of or include ferroelectric hafnium zirconium oxide AFE-HZO, zirconium oxide (ZrO$_2$), aluminum-doped zirconium oxide (Al-doped ZrO$_2$), zirconium oxide (ZrO$_2$), anti-ferroelectric Hafnium zirconium oxide AFE-HZO, aluminum oxide (Al$_2$O$_3$), and titanium oxide (TiO$_2$) that are stacked in the mentioned order.

In the multi-layer stack ML14B, aluminum-doped zirconium oxide (Al-Doped ZrO$_2$) may be thinner than zirconium oxides (ZrO$_2$). The zirconium oxides (ZrO$_2$) and the aluminum-doped zirconium oxide (Al-Doped ZrO$_2$) may each have a tetragonal crystal structure. The ZrO$_2$/Al-doped ZrO$_2$/ZrO$_2$ may also be referred to as aluminum-embedded zirconium oxide (Al-embedded ZrO$_2$).

The aluminum-doped zirconium oxide (Al-doped ZrO$_2$) may be a high band gap layer HBG, which is different from aluminum oxide (Al$_2$O$_3$), which is a high band gap layer HBG in FIG. 4B. The aluminum oxide (Al$_2$O$_3$) of FIG. 4B may have a thickness that separates the grains of the lower zirconium oxide (ZrO$_2$) and the grains of the upper zirconium oxide (ZrO$_2$). The aluminum oxide (Al$_2$O$_3$) may be thicker than aluminum-doped zirconium oxide (AZ), and it may be a continuous layer.

Figure 4D:
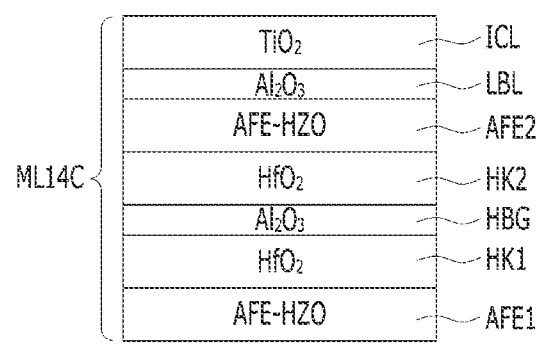

Referring to FIG. 4D, the multi-layer stack ML14C may include an AFE-HZO/HfO$_2$/Al$_2$O$_3$/HfO$_2$/AFE-HZO/Al$_2$O$_3$/TiO$_2$ stack. The first and second anti-ferroelectric layers AFE1 and AFE2 may each include anti-ferroelectric hafnium zirconium oxide AFE-HZO. The first and second high-k dielectric layers HK1 and HK2 may each include hafnium oxide (HfO$_2$). The high band gap layer HBG may be made of or include aluminum oxide (Al$_2$O$_3$). The leakage blocking layer LBL may be made of or include aluminum oxide (Al$_2$O$_3$), and the interface control layer ICL may be made of or include titanium oxide (TiO$_2$).

Therefore, the multi-layer stack ML14C may be made of or include-ferroelectric hafnium zirconium oxide AFE-HZO, hafnium oxide (HfO$_2$), aluminum oxide (Al$_2$O$_3$), hafnium oxide (HfO$_2$), anti-ferroelectric hafnium zirconium oxide AFE-HZO, aluminum oxide (Al$_2$O$_3$), and titanium oxide (TiO$_2$) that are stacked in the mentioned order.

Figure 4E:
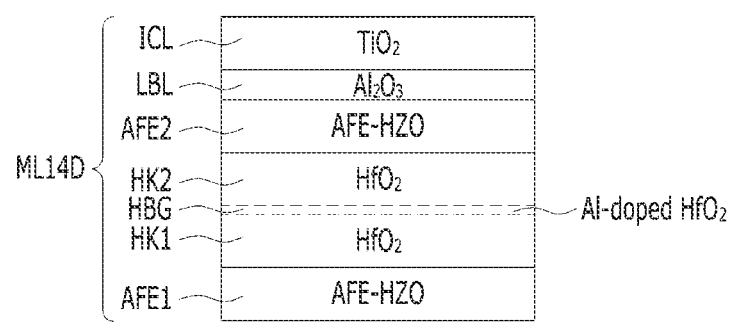

Referring to FIG. 4E, the multi-layer stack ML14D may include an AFE-HZO/HfO$_2$/Al-doped HfO$_2$/HfO$_2$/AFE-HZO/Al$_2$O$_3$/TiO$_2$ stack. The first and second anti-ferroelectric layers AFE1 and AFE2 may each include anti-ferroelectric hafnium zirconium oxide AFE-HZO. The first and second high-k dielectric layers HK1 and HK2 may each include hafnium oxide (HfO$_2$). The high band gap layer HBG may be made of or include aluminum-doped hafnium oxide (Al-doped HfO$_2$). The leakage blocking layer LBL may be made of or include aluminum oxide (Al$_2$O$_3$), and the interface control layer ICL may be made of or include titanium oxide (TiO$_2$). In HfO$_2$/Al-doped HfO$_2$/HfO$_2$, aluminum-doped hafnium oxide (Al-doped HfO$_2$) may not separate the grains of hafnium oxides (HfO$_2$).

Therefore, the multi-layer stack ML14D may be made of or include-ferroelectric hafnium zirconium oxide AFE-HZO, hafnium oxide (HfO$_2$), aluminum-doped hafnium oxide (Al-doped HfO$_2$), hafnium oxide (HfO$_2$), anti-ferroelectric hafnium zirconium oxide AFE-HZO, aluminum oxide (Al$_2$O$_3$), and titanium oxide (TiO$_2$) that are stacked in the mentioned order.

Figure 5:
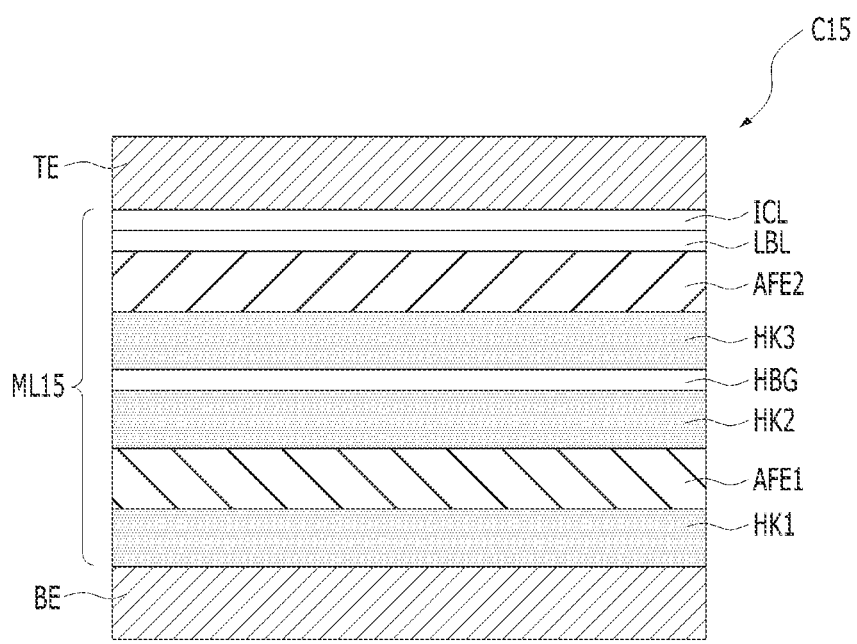
FIG. 5 is a cross-sectional view illustrating a capacitor in accordance with another embodiment of the present invention.

FIG. 5 is a cross-sectional view illustrating a capacitor C15 in accordance with another embodiment of the present invention.

Referring to FIG. 5, the capacitor C15 may include a first electrode BE, a second electrode TE, and a multi-layer stack ML15 positioned between the first electrode BE and the second electrode TE. The multi-layer stack ML15 may include at least one anti-ferroelectric layer AFE1 and AFE2 and at least one high-k dielectric layer HK1, HK2, and HK3. The multi-layer stack ML15 may further include a leakage blocking layer LBL and an interface control layer ICL. According to another embodiment of the present invention, the leakage blocking layer LBL and the interface control layer ICL of the multi-layer stack ML15 may be omitted.

The multi-layer stack ML15 may include a first high-k dielectric layer HK1, a first anti-ferroelectric layer AFE1, a second high-k dielectric layer HK2, a high band gap layer HBG, a third high-k dielectric layer HK3, a second anti-ferroelectric layer AFE2, a leakage blocking layer LBL and an interface control layer ICL that are stacked in the mentioned order. The first anti-ferroelectric layer AFE1 may be positioned between the first high-k dielectric layer HK1 and the second high-k dielectric layer HK2. The second anti-ferroelectric layer AFE2 may be positioned between the third high-k dielectric layer HK3 and the leakage blocking layer LBL. The high band gap layer HBG may be positioned between the second high-k dielectric layer HK2 and the third high-k dielectric layer HK3.

The first high-k dielectric layer HK1, the second high-k dielectric layer HK2, and the third high-k dielectric layer HK3 may be the same material or different materials.

The first high-k dielectric layer HK1, the second high-k dielectric layer HK2, and the third high-k dielectric layer HK3 may be made of or include hafnium or zirconium. The first high-k dielectric layer HK1, the second high-k dielectric layer HK2, and the third high-k dielectric layer HK3 may be made of or include hafnium oxide or zirconium oxide. The first high-k dielectric layer HK1, the second high-k dielectric layer HK2, and the third high-k dielectric layer HK3 may be made of a single layer of hafnium oxide or a single layer of zirconium oxide. The first high-k dielectric layer HK1, the second high-k dielectric layer HK2, and the third high-k dielectric layer HK3 may have a tetragonal crystal structure.

The first high-k dielectric layer HK1, the second high-k dielectric layer HK2, and the third high-k dielectric layer HK3 may be different materials. For example, the first high-k dielectric layer HK1 may be made of a single layer of hafnium oxide, and the second high-k dielectric layer HK2 and the third high-k dielectric layer HK3 may be made of a single layer of zirconium oxide. Also, the first high-k dielectric layer HK1 may be made of a single layer of zirconium oxide, and the second high-k dielectric layer HK2 and the third high-k dielectric layer HK3 may be made of a single layer of hafnium oxide. Also, the first high-k dielectric layer HK1 and the second high-k dielectric layer HK2 may be made of a single layer of hafnium oxide, and the third high-k dielectric layer HK3 may be made of a single layer of zirconium oxide. The first high-k dielectric layer HK1 and the second high-k dielectric layer HK2 may be made of a single layer of zirconium oxide, and the third high-k dielectric layer HK3 may be made of a single layer of hafnium oxide.

At least one among the first high-k dielectric layer HK1, the second high-k dielectric layer HK2, and the third high-k dielectric layer HK3 may be an anti-ferroelectric material. For example, first high-k dielectric layer HK1 may be a zirconium oxide-rich hafnium zirconium oxide (ZR-HZO), and the second high-k dielectric layer HK2 and the third high-k dielectric layer HK3 may be hafnium oxide or zirconium oxide. Also, the first high-k dielectric layer HK1 may be hafnium oxide or zirconium oxide, and the second high-k dielectric layer HK2 and the third high-k dielectric layer HK3 may be a zirconium oxide-rich hafnium zirconium oxide (ZR-HZO).

The multi-layer stack ML15 may include a $ZrO_2$/AFE-HZO/$ZrO_2$/$Al_2O_3$/$ZrO_2$/AFE-HZO/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, and the third high-k dielectric layer HK3 may include zirconium oxide ($ZrO_2$). The high band gap layer HBG may be made of or include aluminum oxide ($Al_2O_3$). The leakage blocking layer LBL may be made of or include aluminum oxide ($Al_2O_3$), and the interface control layer ICL may be made of or include titanium oxide ($TiO_2$).

Therefore, the multi-layer stack ML15 may include zirconium oxide ($ZrO_2$), anti-ferroelectric hafnium zirconium oxide AFE-HZO, zirconium oxide ($ZrO_2$), aluminum oxide ($Al_2O_3$), zirconium oxide ($ZrO_2$), anti-ferroelectric hafnium zirconium oxide AFE-HZO, aluminum oxide ($Al_2O_3$), and titanium oxide ($TiO_2$) that are stacked in the mentioned order.

According to another embodiment of the present invention, the multi-layer stack ML15 may include a $ZrO_2$/AFE-HZO/$ZrO_2$/Al-doped $ZrO_2$/$ZrO_2$/AFE-HZO/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, and the third high-k dielectric layer HK3 may include zirconium oxide ($ZrO_2$). The high band gap layer HBG may be made of or include aluminum-doped zirconium oxide (Al-doped $ZrO_2$). The leakage blocking layer LBL may be made of or include aluminum oxide ($Al_2O_3$), and the interface control layer ICL may be made of or include titanium oxide ($TiO_2$). Therefore, the multi-layer stack ML15 may include zirconium oxide ($ZrO_2$), anti-ferroelectric hafnium zirconium oxide AFE-HZO, zirconium oxide ($ZrO_2$), aluminum-doped zirconium oxide (Al-doped $ZrO_2$), zirconium oxide ($ZrO_2$), anti-ferroelectric hafnium zirconium oxide AFE-HZO, aluminum oxide ($Al_2O_3$), and titanium oxide ($TiO_2$) that are stacked in the mentioned order.

According to another embodiment of the present invention, the multi-layer stack ML15 may include an $HfO_2$/AFE-HZO/$HfO_2$/Al-doped $HfO_2$/$HfO_2$/AFE-HZO/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, and the third high-k dielectric layer HK3 may be made of or include hafnium oxide ($HfO_2$), individually. The high band gap layer HBG may be made of or include aluminum-doped hafnium oxide (Al-doped $HfO_2$). The leakage blocking layer LBL may be made of or include aluminum oxide ($Al_2O_3$), and the interface control layer ICL may be made of or include titanium oxide ($TiO_2$). Thus, the multi-layer stack ML15 may be made of or include hafnium oxide ($HfO_2$), anti-ferroelectric hafnium zirconium oxide AFE-HZO, hafnium oxide ($HfO_2$), aluminum-doped hafnium oxide (Al-doped $HfO_2$), hafnium oxide ($HfO_2$), anti-ferroelectric hafnium zirconium oxide AFE-HZO, aluminum oxide ($Al_2O_3$) and titanium oxide ($HfO_2$) that are stacked in the mentioned order.

According to another embodiment of the present invention, the multi-layer stack ML15 may include an $HfO_2$/AFE-HZO/$HfO_2$/$Al_2O_3$/$HfO_2$/AFE-HZO/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, and the third high-k dielectric layer HK3 may be made of or include hafnium oxide ($HfO_2$), individually. The high band gap layer HBG may be made of or include aluminum oxide ($Al_2O_3$). The leakage blocking layer LBL may be made of or include aluminum oxide ($Al_2O_3$), and the interface control layer ICL may be made of or include titanium oxide ($TiO_2$). Therefore, multi-layer stack ML15 may be made of or include hafnium oxide ($HfO_2$), anti-ferroelectric hafnium zirconium oxide AFE-HZO, hafnium oxide ($HfO_2$), aluminum oxide ($Al_2O_3$), hafnium oxide ($HfO_2$), anti-ferroelectric hafnium zirconium oxide AFE-HZO, aluminum oxide ($Al_2O_3$), and titanium oxide ($TiO_2$).

FIGS. 6A to 6E are cross-sectional views illustrating modified examples of FIG. 5.

Figure 6A:
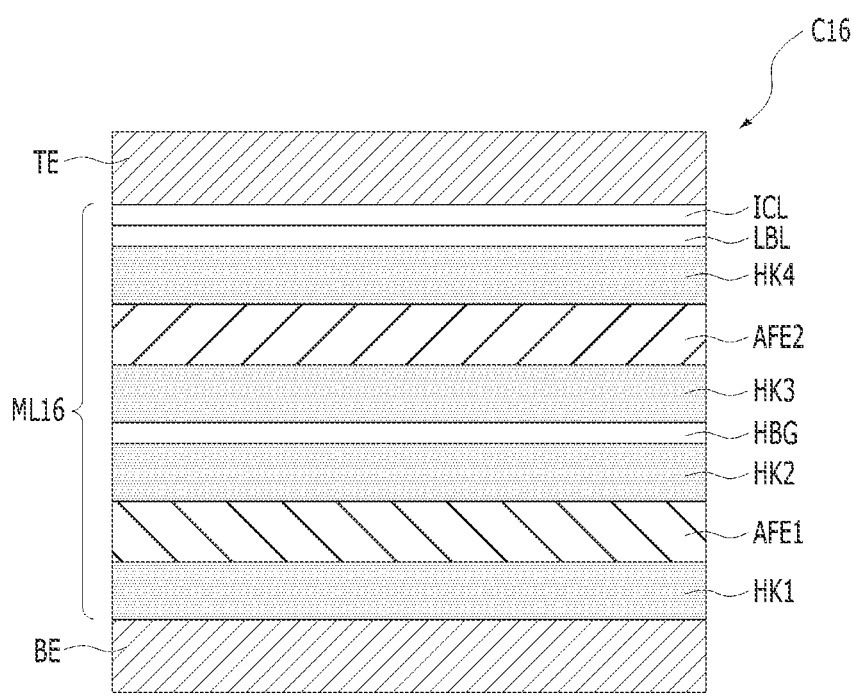
FIGS. 6A to 6E are cross-sectional views illustrating modified examples of FIG. 5.

Referring to FIG. 6A, the capacitor C16 may include a first electrode BE, a second electrode TE, and a multi-layer stack ML16 positioned between the first electrode BE and the second electrode TE. The multi-layer stack ML16 may include at least one anti-ferroelectric layer AFE1 and AFE2 and at least one high-k dielectric layer HK1, HK2, HK3, and HK4. The multi-layer stack ML16 may further include a leakage blocking layer LBL and an interface control layer ICL. According to another embodiment of the present invention, the leakage blocking layer LBL and the interface control layer ICL of the multi-layer stack ML16 may be omitted.

The multi-layer stack ML16 may include a first high-k dielectric layer HK1, a first anti-ferroelectric layer AFE1, a second high-k dielectric layer HK2, a high band gap layer HBG, a third high-k dielectric layer HK3, a second anti-ferroelectric layer AFE2, a fourth high-k dielectric layer HK4, a leakage blocking layer LBL, and an interface control layer ICL. The first anti-ferroelectric layer AFE1 may be positioned between the first high-k dielectric layer HK1 and the second high-k dielectric layer HK2. The second anti-ferroelectric layer AFE2 may be positioned between the third high-k dielectric layer HK3 and the fourth high-k dielectric layer HK4. The high band gap layer HBG may be positioned between the second high-k dielectric layer HK2 and the third high-k dielectric layer HK3.

The first high-k dielectric layer HK1, the second high-k dielectric layer HK2, the third high-k dielectric layer HK3, and the fourth high-k dielectric layer HK4 may be the same material or different materials.

The first high-k dielectric layer HK1, the second high-k dielectric layer HK2, the third high-k dielectric layer HK3 and the fourth high-k dielectric layer HK4 may be made of or include hafnium or zirconium. The first high-k dielectric layer HK1, the second high-k dielectric layer HK2, the third high-k dielectric layer HK3, and the fourth high-k dielectric layer HK4 may be made of or include hafnium oxide or zirconium oxide. The first high-k dielectric layer HK1, the second high-k dielectric layer HK2, the third high-k dielectric layer HK3, and the fourth high-k dielectric layer HK4 may be made of a single layer of hafnium oxide or a single layer of zirconium oxide.

At least one among the first high-k dielectric layer HK1, the second high-k dielectric layer HK2, the third high-k dielectric layer HK3, and the fourth high-k dielectric layer HK4 may be an anti-ferroelectric material. At least one among the first high-k dielectric layer HK1, the second high-k dielectric layer HK2, the third high-k dielectric layer HK3, and the fourth high-k dielectric layer HK4 may be a zirconium oxide-rich hafnium zirconium oxide.

Figure 6B:
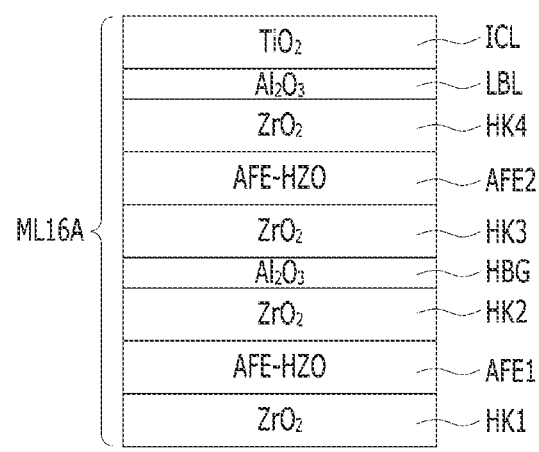

Referring to FIG. 6B, the multi-layer stack ML16A may include a $ZrO_2$/AFE-HZO/$ZrO_2$/$Al_2O_3$/$ZrO_2$/AFE-HZO/$ZrO_2$/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, the third high-k dielectric layer HK3, and the fourth high-k dielectric layer HK4 may include zirconium oxide ($ZrO_2$). The high band gap layer HBG may be made of or include aluminum oxide ($Al_2O_3$). The leakage blocking layer LBL may be made of or include aluminum oxide ($Al_2O_3$), and the interface control layer ICL may be made of or include titanium oxide ($TiO_2$).

Therefore, the multi-layer stack ML20 may include zirconium oxide ($ZrO_2$), anti-ferroelectric hafnium zirconium oxide AFE-HZO, zirconium oxide ($ZrO_2$), aluminum oxide ($Al_2O_3$), zirconium oxide ($ZrO_2$), anti-ferroelectric hafnium zirconium oxide AFE-HZO, zirconium oxide ($ZrO_2$), aluminum oxide ($Al_2O_3$) and titanium oxide ($ZrO_2$).

Figure 6C:
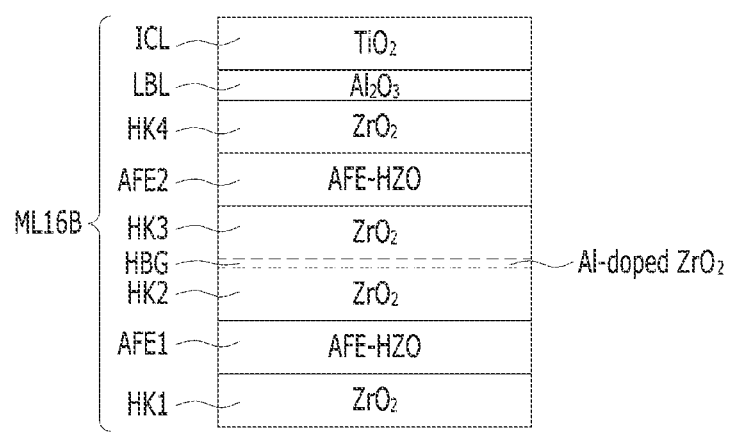

Referring to FIG. 6C, the multi-layer stack ML16B may include a $ZrO_2$/AFE-HZO/$ZrO_2$/Al-doped $ZrO_2$/$ZrO_2$/AFE-HZO/$ZrO_2$/$Al_2O_3$/$TiO_2$ stack. The first and second anti-ferroelectric layers AFE1 and AFE2 may each include anti-ferroelectric hafnium zirconium oxide AFE-HZO. The first high-k dielectric layer HK1, the second high-k dielectric layer HK2, the third high-k dielectric layer HK3, and the fourth high-k dielectric layer HK4 may include zirconium oxide ($ZrO_2$). The high band gap layer HBG may be made of or include aluminum-doped zirconium oxide (Al-doped $ZrO_2$). The leakage blocking layer LBL may be made of or include aluminum oxide ($Al_2O_3$), and the interface control layer ICL may be made of or include titanium oxide ($TiO_2$).

Therefore, the multi-layer stack ML16B may include zirconium oxide ($ZrO_2$), anti-ferroelectric hafnium zirconium oxide AFE-HZO, zirconium oxide ($ZrO_2$), aluminum-doped zirconium oxide (Al-doped $ZrO_2$), zirconium oxide ($ZrO_2$), anti-ferroelectric hafnium zirconium oxide AFE-HZO, zirconium oxide ($ZrO_2$), aluminum oxide ($Al_2O_3$) and titanium oxide ($TiO_2$) that are stacked in the mentioned order.

Figure 6D:
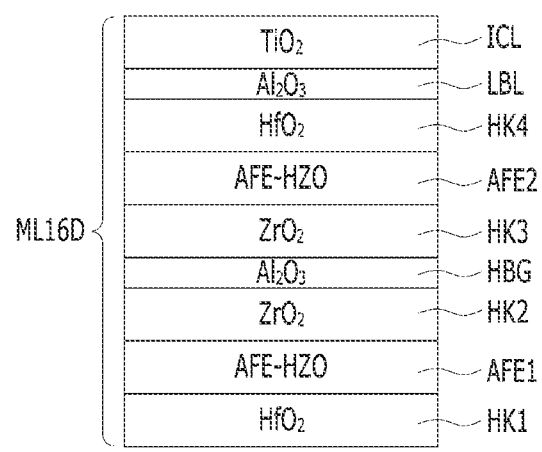

Referring to FIG. 6D, the multi-layer stack ML16C may include an $HfO_2$/AFE-HZO/$ZrO_2$/$Al_2O_3$/$ZrO_2$/AFE-HZO/$HfO_2$/$Al_2O_3$/$TiO_2$ stack. The first and second anti-ferroelectric layers AFE1 and AFE2 may each include anti-ferroelectric hafnium zirconium oxide AFE-HZO. The second high-k dielectric layer HK2 and the third high-k dielectric layer HK3 may include zirconium oxide ($ZrO_2$), and the first high-k dielectric layer HK1 and the fourth high-k dielectric layer HK4 may be made of or include hafnium oxide ($HfO_2$), individually. The high band gap layer HBG may be made of or include aluminum oxide ($Al_2O_3$). The leakage blocking layer LBL may be made of or include aluminum oxide ($Al_2O_3$), and the interface control layer ICL may be made of or include titanium oxide ($TiO_2$).

Therefore, the multi-layer stack ML16C may be made of or include hafnium oxide ($HfO_2$), anti-ferroelectric hafnium zirconium oxide AFE-HZO, zirconium oxide ($ZrO_2$), aluminum oxide ($Al_2O_3$), zirconium oxide ($ZrO_2$), anti-ferroelectric hafnium Zirconium oxide AFE-HZO, hafnium oxide ($HfO_2$), aluminum oxide ($Al_2O_3$), and titanium oxide ($TiO_2$) that are stacked in the mentioned order.

Figure 6E:
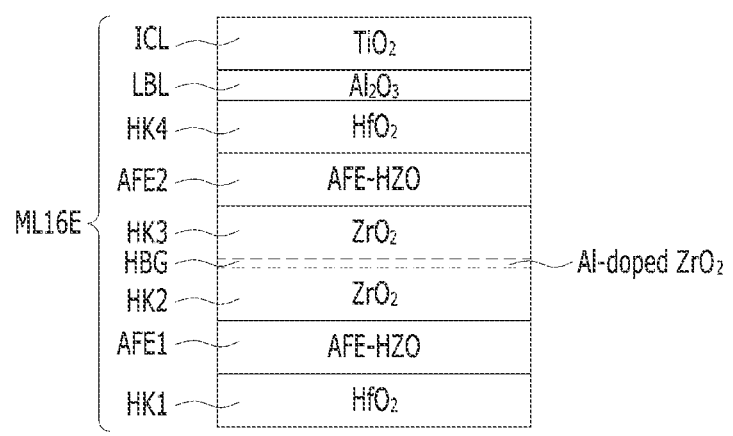

Referring to FIG. 6E, the multi-layer stack ML16E may include an $HfO_2$/AFE-HZO/$ZrO_2$/Al-doped $ZrO_2$/$ZrO_2$/AFE-HZO/$HfO_2$/$Al_2O_3$/$TiO_2$ stack. The first and second anti-ferroelectric layers AFE1 and AFE2 may each include anti-ferroelectric hafnium zirconium oxide AFE-HZO. The second high-k dielectric layer HK2 and the third high-k dielectric layer HK3 may include zirconium oxide ($ZrO_2$), and the first high-k dielectric layer HK1 and the fourth high-k dielectric layer HK4 may be made of or include hafnium oxide ($HfO_2$), individually. The high band gap layer HBG may be made of or include aluminum-doped zirconium oxide (Al-doped $ZrO_2$). The leakage blocking layer LBL may be made of or include aluminum oxide ($Al_2O_3$), and the interface control layer ICL may be made of or include titanium oxide ($TiO_2$).

Therefore, the multi-layer stack ML16E may be made of or include hafnium oxide ($HfO_2$), anti-ferroelectric hafnium zirconium oxide AFE-HZO, zirconium oxide ($ZrO_2$), aluminum-doped zirconium oxide (Al-doped $ZrO_2$), zirconium oxide ($ZrO_2$), anti-ferroelectric hafnium zirconium oxide AFE-HZO, hafnium oxide ($HfO_2$), aluminum oxide ($Al_2O_3$) and titanium oxide ($TiO_2$) that are stacked in the mentioned order.

Figure 7:
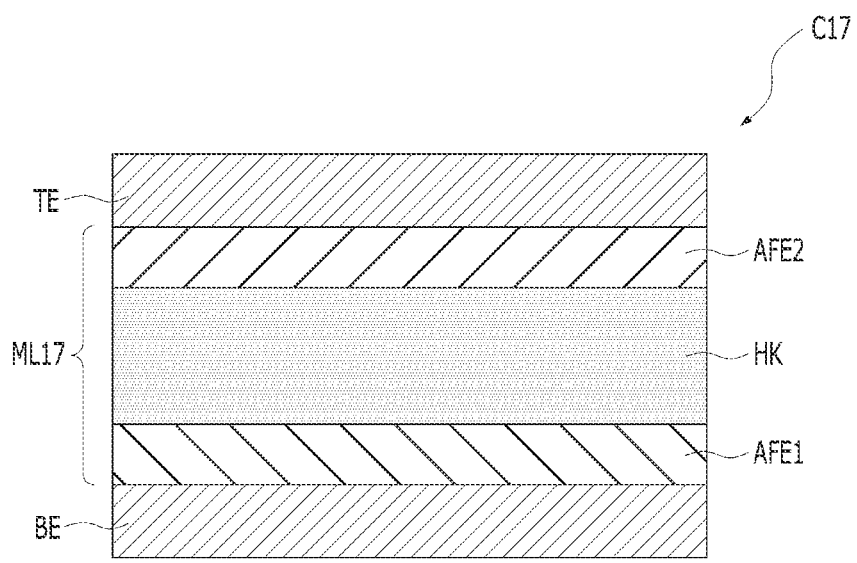
FIGS. 7 to 15 are cross-sectional views illustrating capacitors in accordance with other embodiments of the present invention.

FIG. 7 is a cross-sectional view illustrating a capacitor in accordance with another embodiment of the present invention.

Referring to FIG. 7, the capacitor C17 may include a first electrode BE, a second electrode TE, and a multi-layer stack ML17 between the first electrode BE and the second electrode TE. The multi-layer stack ML17 may include at least one anti-ferroelectric layer AFE1 and AFE2 and one high-k dielectric layer HK.

The multi-layer stack ML17 may include a first anti-ferroelectric layer AFE1, a high-k dielectric layer HK, and a second anti-ferroelectric layer AFE2 that are stacked in the mentioned order. The high-k dielectric layer HK may be positioned between the first anti-ferroelectric layer AFE1 and the second anti-ferroelectric layer AFE2. The high-k dielectric layer HK may be thicker than the high-k dielectric layers HK1, HK2, HK3 and HK4 of FIGS. 1 to 6E. The high-k dielectric layer HK may be thicker than the first anti-ferroelectric layer AFE1 and the second anti-ferroelectric layer AFE2. The high-k dielectric layer HK may have a thickness of approximately 50 to 100 Å. The first anti-ferroelectric layer AFE1 and the second anti-ferroelectric layer AFE2 may each have a thickness of approximately 50 Å or less.

The high-k dielectric layer HK may be made of or include hafnium or zirconium. The high-k dielectric layer HK may be made of or include hafnium oxide or zirconium oxide. The high-k dielectric layer HK may be made of a single layer of hafnium oxide. The high-k dielectric layer HK may be made of a single layer of zirconium oxide. According to another embodiment of the present invention, the high-k dielectric layer HK may be an anti-ferroelectric material. For example, the high-k dielectric layer HK may include a zirconium oxide-rich hafnium zirconium oxide.

Figure 8:
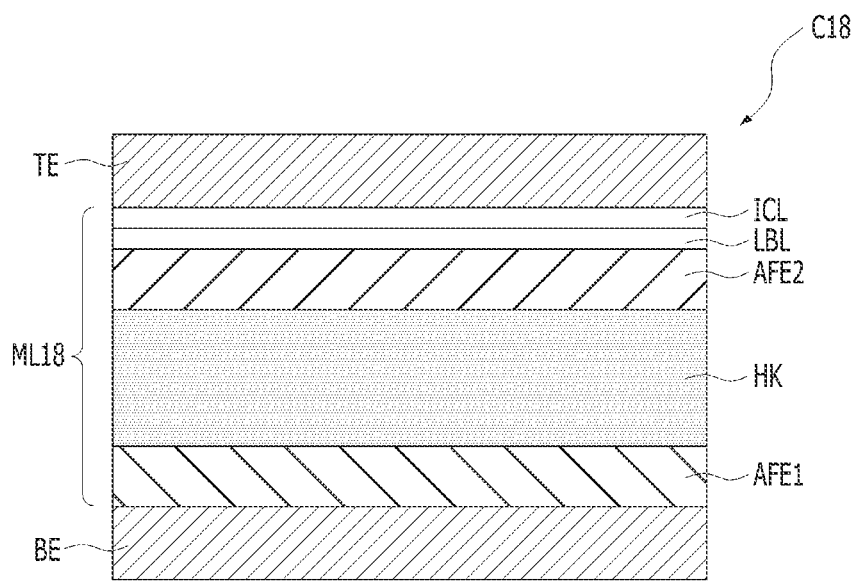

FIG. 8 is a cross-sectional view illustrating a capacitor in accordance with another embodiment of the present invention.

Referring to FIG. 8, the capacitor C18 may be similar to the capacitor C17 of FIG. 7. Hereinafter, a detailed description on the constituent elements that also appear in FIG. 7 may be omitted.

The capacitor C18 may include a first electrode BE, a second electrode TE, and a multi-layer stack ML18 positioned between the first electrode BE and the second electrode TE. The multi-layer stack ML18 may include at least one anti-ferroelectric layer AFE1 and AFE2 and one high-k dielectric layer HK. The multi-layer stack ML18 may further include a leakage blocking layer LBL and an interface control layer ICL.

The multi-layer stack ML18 may include a first anti-ferroelectric layer AFE1, a high-k dielectric layer HK, a second anti-ferroelectric layer AFE2, a leakage blocking layer LBL, and an interface control layer ICL that are stacked in the mentioned order. The high-k dielectric layer HK may be positioned between the first anti-ferroelectric layer AFE1 and the second anti-ferroelectric layer AFE2. The high-k dielectric layer HK may be thicker than the first anti-ferroelectric layer AFE1 and the second anti-ferroelectric layer AFE2. The high-k dielectric layer HK may have a thickness of approximately 50 to 100 Å. The first anti-ferroelectric layer AFE1 and the second anti-ferroelectric layer AFE2 may each have a thickness of approximately 50 Å or less.

The leakage blocking layer LBL and the interface control layer ICL may be positioned between the second anti-ferroelectric layer AFE2 and the second electrode TE. The leakage blocking layer LBL may be positioned between the second anti-ferroelectric layer AFE2 and the interface control layer ICL. The interface control layer ICL may be positioned between the leakage blocking layer LBL and the second electrode TE. As for the description on the leakage blocking layer LBL and the interface control layer ICL, FIG. 2 and the accompanying description may be referred to.

FIGS. 9 to 17C illustrate capacitors in accordance with other embodiments of the present invention. The capacitors in accordance with other embodiments of the present invention shown in FIGS. 9 to 17C may have constituent elements similar to those of the capacitors in accordance with FIGS. 1 to 8. Hereinafter, as for the detailed description on the constituent elements that also appear in FIGS. 1 to 8, FIGS. 1 to 8 and the accompanying description may be referred to.

Figure 9:
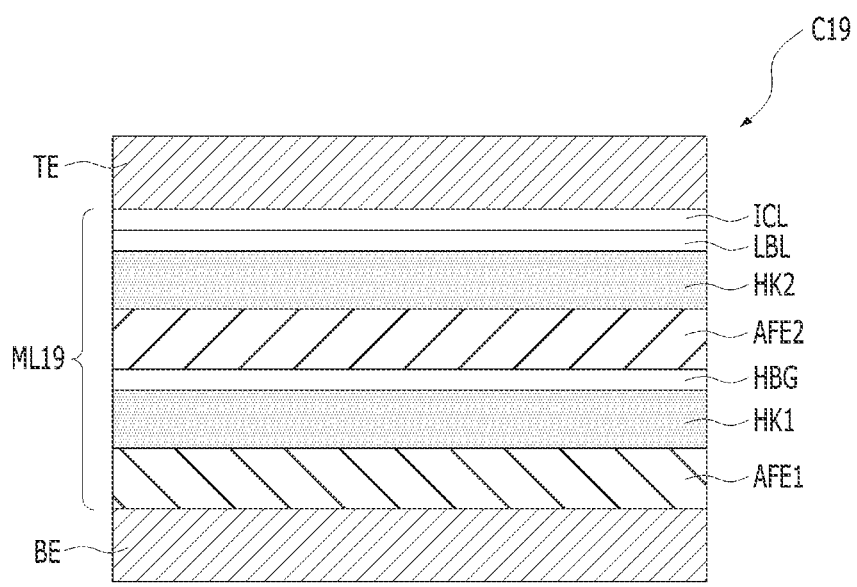

Referring to FIG. 9, a capacitor C19 may include a first electrode BE, a second electrode TE, and a multi-layer stack ML19 positioned between the first electrode BE and the second electrode TE. The multi-layer stack ML19 may include at least one anti-ferroelectric layer AFE1 and AFE2 and at least one high-k dielectric layer HK1 and HK2. The multi-layer stack ML19 may further include a leakage blocking layer LBL and an interface control layer ICL. According to another embodiment of the present invention, the leakage blocking layer LBL and the interface control layer ICL of the multi-layer stack ML19 may be omitted.

The multi-layer stack ML19 may include a first anti-ferroelectric layer AFE1, a first high-k dielectric layer HK1, a high band gap layer HBG, a second anti-ferroelectric layer AFE2, a second high-k dielectric layer HK2, a leakage blocking layer LBL, and an interface control layer ICL that are stacked in the mentioned order. The first anti-ferroelectric layer AFE1 may be in direct contact with the first electrode BE and the first high-k dielectric layer HK1. The first anti-ferroelectric layer AFE1 may be positioned between the first electrode BE and the first high-k dielectric layer HK1. The second anti-ferroelectric layer AFE2 may be in direct contact with the second high-k dielectric layer HK2 and the high band gap layer HBG. The second anti-ferroelectric layer AFE2 may be positioned between the high band gap layer HGB and the second high-k dielectric layer HK2.

Unlike the above-described embodiments of the present invention, the high band gap layer HBG of the multi-layer stack ML19 may be positioned between the first high-k dielectric layer HK1 and the second anti-ferroelectric layer AFE2. Referring back to FIGS. 1 and 2, the high band gap layer HBG may be positioned between the first anti-ferroelectric layer AFE1 and the second anti-ferroelectric layer AFE2. Referring back to FIG. 3, the high band gap layer HBG may be positioned between the first high-k dielectric layer HK1 and the second high-k dielectric layer HK2.

The multi-layer stack ML19 may include a first stack that includes a first anti-ferroelectric layer AFE1 and a first high-k dielectric layer HK1 over the first anti-ferroelectric layer AFE1, and a second stack that includes a second anti-ferroelectric layer AFE2 and a second high-k dielectric layer HK2 over the second anti-ferroelectric layer AFE2. A leakage blocking layer LBL may be positioned between the first stack and the second stack.

Figure 10:
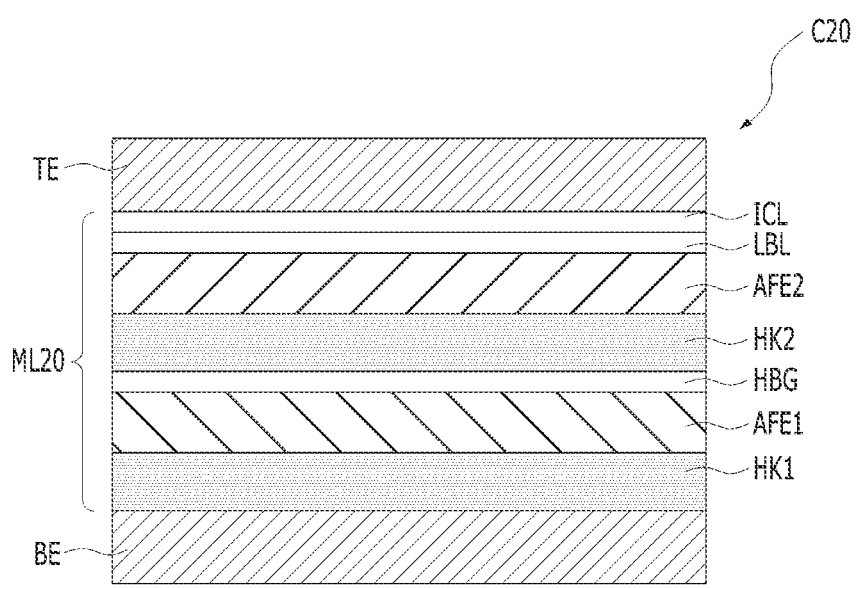

Referring to FIG. 10, a capacitor C20 may include a first electrode BE, a second electrode TE, and a multi-layer stack ML20 positioned between the first electrode BE and the second electrode TE. The multi-layer stack ML20 may include at least one anti-ferroelectric layer AFE1 and AFE2 and at least one high-k dielectric layer HK1 and HK2. The multi-layer stack ML20 may further include a leakage blocking layer LBL and an interface control layer ICL. According to another embodiment of the present invention, the leakage blocking layer LBL and the interface control layer ICL of the multi-layer stack ML20 may be omitted.

The multi-layer stack ML20 may include a first high-k dielectric layer HK1, a first anti-ferroelectric layer AFE1, a high band gap layer HBG, a second high-k dielectric layer HK2, a second anti-ferroelectric layer AFE2, a leakage blocking layer LBL, and an interface control layer ICL that are stacked in the mentioned order. The first anti-ferroelectric layer AFE1 may be in direct contact with the first high-k dielectric layer HK1 and the high band gap layer HBG, and may be positioned between the first high-k dielectric layer HK1 and the high band gap layer HBG. The second anti-ferroelectric layer AFE2 may be in direct contact with the second high-k dielectric layer HK2 and the leakage blocking layer LBL, and may be positioned between the second high-k dielectric layer HK2 and the leakage blocking layer LBL.

The high band gap layer HBG of the multi-layer stack ML20 may be positioned between the first anti-ferroelectric layer AFE1 and the second high-k dielectric layer HK2.

The multi-layer stack ML20 may include a first stack that includes a first high-k dielectric layer HK1 and a first anti-ferroelectric layer AFE1 over the first high-k dielectric layer HK1, and a second stack that includes a second high-k dielectric layer HK2 and a second anti-ferroelectric layer AFE2 over the second high-k dielectric layer HK2. A leakage blocking layer LBL may be positioned between the first stack and the second stack.

Figure 11:
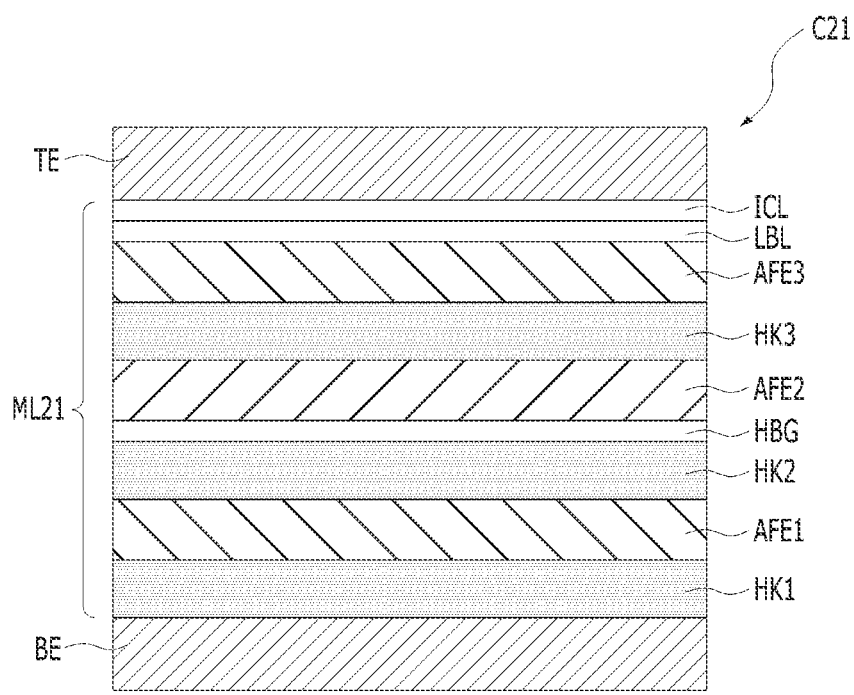

Referring to FIG. 11, a capacitor C21 may include a first electrode BE, a second electrode TE, and a multi-layer stack ML21 positioned between the first electrode BE and the second electrode TE. The multi-layer stack ML21 may include at least one anti-ferroelectric layer AFE1, AFE2 and AFE3 and at least one high-k dielectric layer HK1, HK2 and HK3. The multi-layer stack ML21 may further include a leakage blocking layer LBL and an interface control layer ICL. According to another embodiment of the present invention, the leakage blocking layer LBL and the interface control layer ICL of the multi-layer stack ML21 may be omitted.

The multi-layer stack ML21 may include a first high-k dielectric layer HK1, a first anti-ferroelectric layer AFE1, a second high-k dielectric layer HK2, a high band gap layer HBG, a second anti-ferroelectric layer AFE2, a third high-k dielectric layer HK3, a third anti-ferroelectric layer AFE3, a leakage blocking layer LBL, and an interface control layer ICL that are stacked in the mentioned order.

The first anti-ferroelectric layer AFE1 may be positioned between the first high-k dielectric layer HK1 and the second high-k dielectric layer HK2. The second anti-ferroelectric layer AFE2 may be positioned between the high band gap layer HBG and the third high-k dielectric layer HK3. The third anti-ferroelectric layer AFE3 may be positioned between the third high-k dielectric layer HK3 and the leakage blocking layer LBL. The high band gap layer HBG may be positioned between the second high-k dielectric layer HK2 and the second anti-ferroelectric layer AFE2.

The first anti-ferroelectric layer AFE1, the second anti-ferroelectric layer AFE2, and the third anti-ferroelectric layer AFE3 may be made of or include hafnium (Hf) and zirconium (Zr). The first anti-ferroelectric layer AFE1, the second anti-ferroelectric layer AFE2, and the third anti-ferroelectric layer AFE3 may be made of or include anti-ferroelectric hafnium zirconium oxide. As the first anti-ferroelectric layer AFE1, the second anti-ferroelectric layer AFE2, and the third anti-ferroelectric layer AFE3, the anti-ferroelectric hafnium zirconium oxide may include a base hafnium zirconium oxide, a hafnium oxide-rich hafnium zirconium oxide, or a zirconium oxide-rich hafnium zirconium oxide.

According to the embodiments of the present invention, the first anti-ferroelectric layer AFE1, the second anti-ferroelectric layer AFE2, and the third anti-ferroelectric layer AFE3 may be made of or include an anti-ferroelectric hafnium zirconium oxide having a thickness of approximately 50 Å or less (5 to 50 Å). For example, the first anti-ferroelectric layer AFE1, the second anti-ferroelectric layer AFE2, and the third anti-ferroelectric layer AFE3 may contain $Hf_xZr_yO$ (x=y) whose hafnium oxide content (x) and zirconium oxide content (y) are the same. In this case, the thickness may be approximately 50 Å or less. According to another embodiment of the present invention, the first anti-ferroelectric layer AFE1, the second anti-ferroelectric layer AFE2, and the third anti-ferroelectric layer AFE3 may be made of or include $Hf_xZr_yO$ (x>y) whose hafnium oxide content (x) is greater than the zirconium oxide content (y). In this case, the thickness may be less than approximately 30 Å. According to another embodiment of the present invention, the first anti-ferroelectric layer AFE1, the second anti-ferroelectric layer AFE2, and the third anti-ferroelectric layer AFE3 may be made of or include $Hf_xZr_yO$ (y>x) whose zirconium oxide content (y) is greater than the hafnium oxide content (x). In this case, the thickness may be approximately 50 Å or less.

The first anti-ferroelectric layer AFE1, the second anti-ferroelectric layer AFE2, and the third anti-ferroelectric layer AFE3 may be anti-ferroelectric hafnium zirconium oxides of the same type material or same material.

According to another embodiment of the present invention, the first anti-ferroelectric layer AFE1, the second anti-ferroelectric layer AFE2, and the third anti-ferroelectric layer AFE3 may be anti-ferroelectric hafnium zirconium oxides of different materials.

According to another embodiment of the present invention, the first anti-ferroelectric layer AFE1, the second anti-ferroelectric layer AFE2, and the third anti-ferroelectric layer AFE3 may made of or include the same anti-ferroelectric material, and they may have the same thickness or different thicknesses.

According to another embodiment of the present invention, the first anti-ferroelectric layer AFE1, the second anti-ferroelectric layer AFE2, and the third anti-ferroelectric layer AFE3 may be made of or include different anti-ferroelectric materials, and they may have the same thickness or different thicknesses.

According to another embodiment of the present invention, the first anti-ferroelectric layer AFE1, the second anti-ferroelectric layer AFE2, and the third anti-ferroelectric layer AFE3 may be anti-ferroelectric hafnium zirconium oxides having the same hafnium oxide content.

According to another embodiment of the present invention, the first anti-ferroelectric layer AFE1, the second anti-ferroelectric layer AFE2, and the third anti-ferroelectric layer AFE3 may be anti-ferroelectric hafnium zirconium oxides having different hafnium oxide contents.

Figure 12:
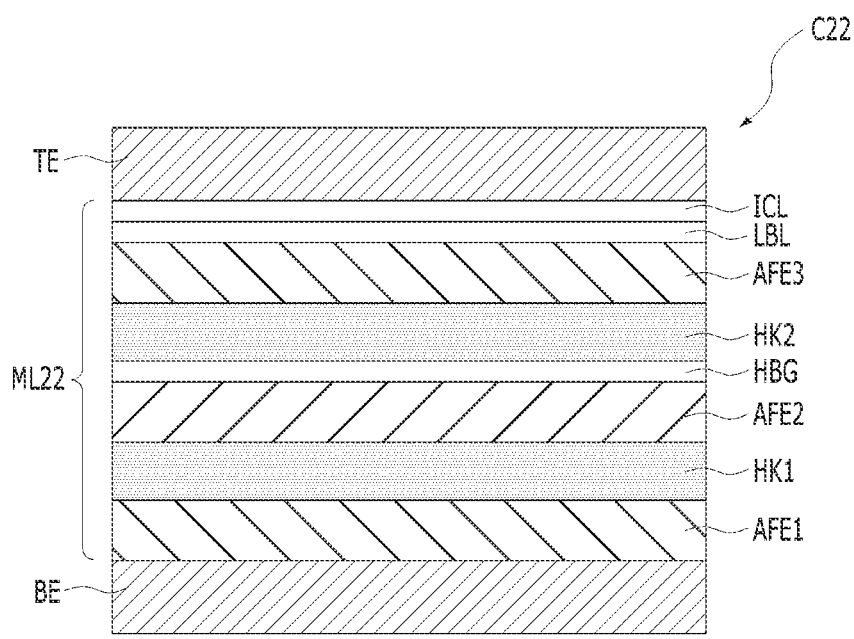

Referring to FIG. 12, a capacitor C22 may include a first electrode BE, a second electrode TE, and a multi-layer stack ML22 positioned between the first electrode BE and the second electrode TE. The multi-layer stack ML22 may include at least one anti-ferroelectric layer AFE1, AFE2 and AFE3 and at least one high-k dielectric layer HK1 and HK2. The multi-layer stack ML22 may further include a leakage blocking layer LBL and an interface control layer ICL. According to another embodiment of the present invention, the leakage blocking layer LBL and the interface control layer ICL of the multi-layer stack ML22 may be omitted.

The multi-layer stack ML22 may include the first anti-ferroelectric layer AFE1, the first high-k dielectric layer HK1, the second anti-ferroelectric layer AFE2, the high band gap layer HBG, the second high-k dielectric layer HK2, the third anti-ferroelectric layer AFE3, the leakage blocking layer LBL and the interface control layer ICL that are stacked in the mentioned order.

The first anti-ferroelectric layer AFE1 may be positioned between the first electrode BE and the first high-k dielectric layer HK1. The second anti-ferroelectric layer AFE2 may be positioned between the first high-k dielectric layer HK1 and the high band gap layer HBG. The third anti-ferroelectric layer AFE3 may be positioned between the second high-k dielectric layer HK2 and the leakage blocking layer LBL. The high band gap layer HBG may be positioned between the second anti-ferroelectric layer AFE2 and the second high-k dielectric layer HK2.

Figure 13:
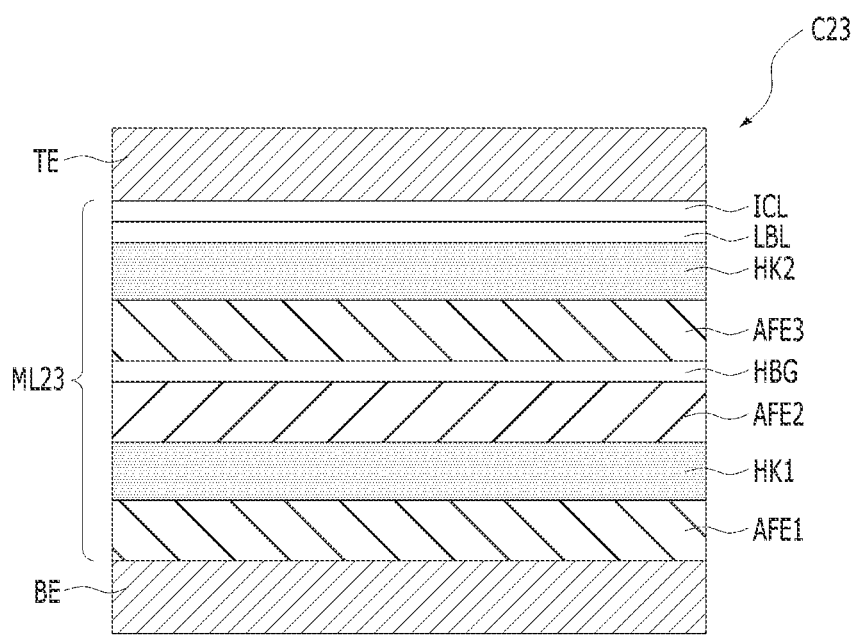

Referring to FIG. 13, a capacitor C23 may include a first electrode BE, a second electrode TE, and a multi-layer stack ML23 positioned between the first electrode BE and the second electrode TE. The multi-layer stack ML23 may include at least one anti-ferroelectric layer AFE1, AFE2 and AFE3 and at least one high-k dielectric layer HK1 and HK2. The multi-layer stack ML23 may further include a leakage blocking layer LBL and an interface control layer ICL. According to another embodiment of the present invention, the leakage blocking layer LBL and the interface control layer ICL of the multi-layer stack ML23 may be omitted.

The multi-layer stack ML23 may include a first anti-ferroelectric layer AFE1, a high-k dielectric layer HK1, a second anti-ferroelectric layer AFE2, a high band gap layer HBG, a third anti-ferroelectric layer AFE3, a second high-k dielectric layer HK2, a leakage blocking layer LBL, and an interface control layer ICL that are stacked in the mentioned order.

The first anti-ferroelectric layer AFE1 may be positioned between the first electrode BE and the first high-k dielectric layer HK1. The second anti-ferroelectric layer AFE2 may be positioned between the first high-k dielectric layer HK1 and the high band gap layer HBG. The third anti-ferroelectric layer AFE3 may be positioned between the high band gap layer HBG and the second high-k dielectric layer HK2. The high band gap layer HBG may be positioned between the second anti-ferroelectric layer AFE2 and the third anti-ferroelectric layer AFE3.

Figure 14:
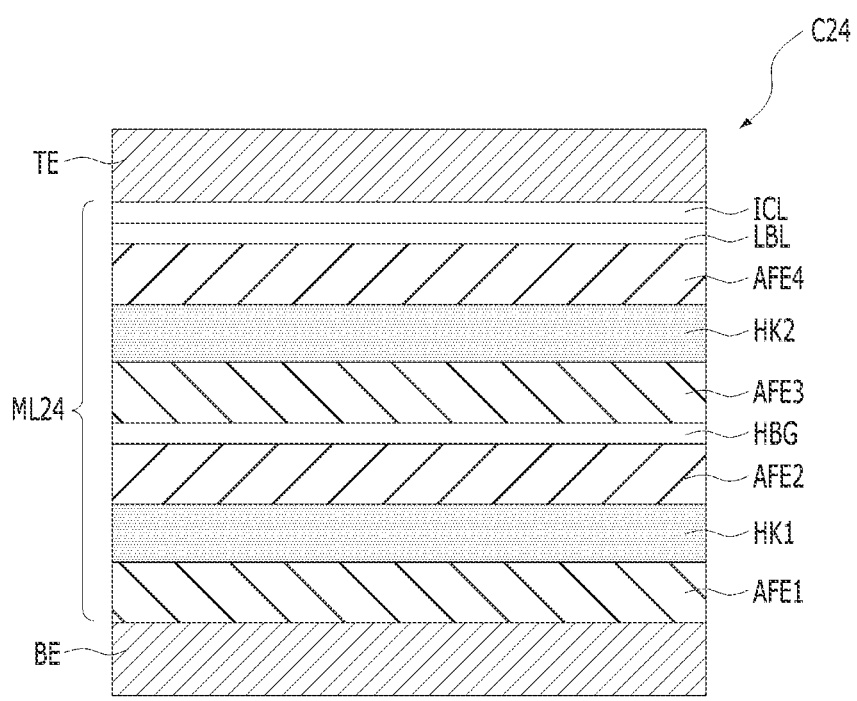

Referring to FIG. 14, a capacitor C24 may include a first electrode BE, a second electrode TE, and a multi-layer stack ML24 between the first electrode BE and the second electrode TE. The multi-layer stack ML24 may include at least one anti-ferroelectric layer AFE1, AFE2, AFE3 and AFE4 and at least one high-k dielectric layer HK1 and HK2. The multi-layer stack ML24 may further include a leakage blocking layer LBL and an interface control layer ICL. According to another embodiment of the present invention, the leakage blocking layer LBL and the interface control layer ICL of the multi-layer stack ML24 may be omitted.

The multi-layer stack ML24 may include a first anti-ferroelectric layer AFE1, a first high-k dielectric layer HK1, a second anti-ferroelectric layer AFE2, a high band gap layer HBG, a third anti-ferroelectric layer AFE3, a second high-k dielectric layer HK2, a fourth anti-ferroelectric layer AFE4, a leakage blocking layer LBL, and an interface control layer ICL that are stacked in the mentioned order.

The first anti-ferroelectric layer AFE1 may be positioned between the first electrode BE and the first high-k dielectric layer HK1. The second anti-ferroelectric layer AFE2 may be positioned between the first high-k dielectric layer HK1 and the high band gap layer HBG. The third anti-ferroelectric layer AFE3 may be positioned between the high band gap layer HBG and the second high-k dielectric layer HK2. The fourth anti-ferroelectric layer AFE4 may be positioned between the second high-k dielectric layer HK2 and the leakage blocking layer LBL. The high band gap layer HBG may be positioned between the second anti-ferroelectric layer AFE2 and the third anti-ferroelectric layer AFE3.

The first anti-ferroelectric layer AFE1, the second anti-ferroelectric layer AFE2, the third anti-ferroelectric layer AFE3, and the fourth anti-ferroelectric layer AFE4 may be made of or include hafnium (Hf) and zirconium (Zr). The first anti-ferroelectric layer AFE1, the second anti-ferroelectric layer AFE2, the third anti-ferroelectric layer AFE3 and the fourth anti-ferroelectric layer AFE4 may be made of or include anti-ferroelectric hafnium zirconium oxide.

The first anti-ferroelectric layer AFE1, the second anti-ferroelectric layer AFE2, the third anti-ferroelectric layer AFE3, and the fourth anti-ferroelectric layer AFE4 may be anti-ferroelectric hafnium zirconium oxides of different materials.

According to another embodiment of the present invention, the first anti-ferroelectric layer AFE1, the second anti-ferroelectric layer AFE2, the third anti-ferroelectric layer AFE3, and the fourth anti-ferroelectric layer AFE4 may include the same anti-ferroelectric material, and they may have the same thickness or different thicknesses.

According to another embodiment of the present invention, the first anti-ferroelectric layer AFE1, the second anti-ferroelectric layer AFE2, the third anti-ferroelectric layer AFE3, and the fourth anti-ferroelectric layer AFE4 may include different anti-ferroelectric materials, and they may have the same thickness or different thicknesses.

According to another embodiment of the present invention, the first anti-ferroelectric layer AFE1, the second anti-ferroelectric layer AFE2, the third anti-ferroelectric layer AFE3, and the fourth anti-ferroelectric layer AFE4 may be anti-ferroelectric hafnium zirconium oxides having the same hafnium oxide content.

According to another embodiment of the present invention, the first anti-ferroelectric layer AFE1, the second anti-ferroelectric layer AFE2, the third anti-ferroelectric layer AFE3, and the fourth anti-ferroelectric layer AFE4 may be anti-ferroelectric hafnium zirconium oxides having different hafnium oxide contents.

Figure 15:
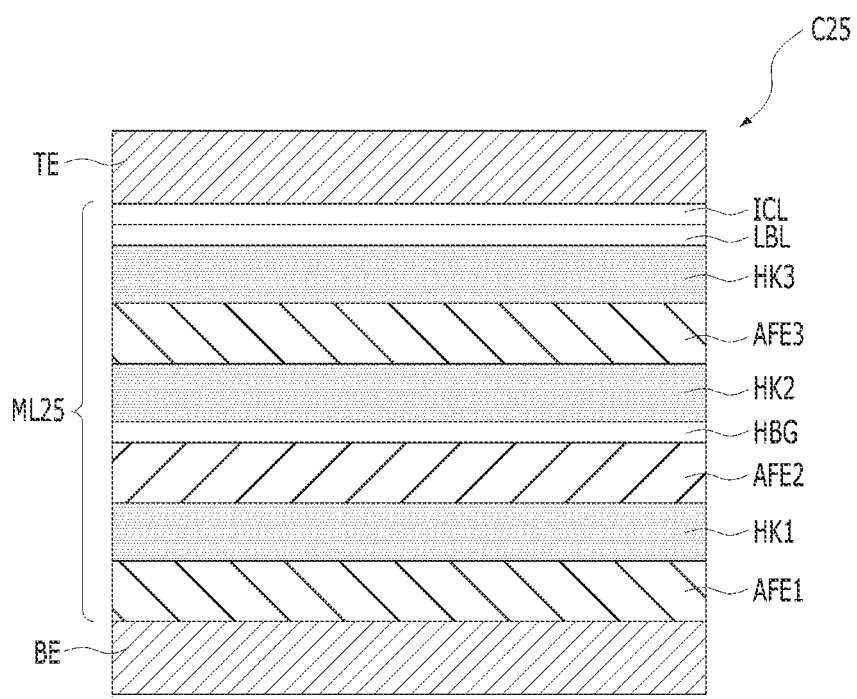

Referring to FIG. 15, the capacitor C25 may include a first electrode BE, a second electrode TE, and a multi-layer stack ML25 positioned between the first electrode BE and the second electrode TE. The multi-layer stack ML25 may include at least one anti-ferroelectric layer AFE1, AFE2 and AFE3 and at least one high-k dielectric layer HK1, HK2 and HK3. The multi-layer stack ML25 may further include a leakage blocking layer LBL and an interface control layer ICL. According to another embodiment of the present invention, the leakage blocking layer LBL and the interface control layer ICL of the multi-layer stack ML25 may be omitted.

The multi-layer stack ML25 may include a first anti-ferroelectric layer AFE1, a first high-k dielectric layer HK1, a second anti-ferroelectric layer AFE2, a high band gap layer HBG, a second high-k dielectric layer HK2, a third anti-ferroelectric layer AFE3, a third high-k dielectric layer HK3, a leakage blocking layer LBL and an interface control layer ICL that are stacked in the mentioned order.

The first anti-ferroelectric layer AFE1 may be positioned between the first electrode BE and the first high-k dielectric layer HK1. The second anti-ferroelectric layer AFE2 may be positioned between the first high-k dielectric layer HK1 and the high band gap layer HBG. The third anti-ferroelectric layer AFE3 may be positioned between the second high-k dielectric layer HK2 and the third high-k dielectric layer HK3. The high band gap layer HBG may be positioned between the second anti-ferroelectric layer AFE2 and the second high-k dielectric layer HK2.

Referring to FIGS. 1 to 15, the anti-ferroelectric layers AFE1, AFE2, AFE3 and AFE4 may include materials exposed to the subsequent annealing process to improve crystallinity. The anti-ferroelectric layers AFE1, AFE2, AFE3 and AFE4 may have a tetragonal crystal structure by the annealing process. The tetragonal crystal structure may have an increased dielectric constant than other crystal structures (e.g., amorphous or monoclinic systems).

Referring to FIGS. 1 to 10, all of the anti-ferroelectric layers AFE1 and AFE2 may be formed of hafnium oxide-rich hafnium zirconium oxide. Referring to FIGS. 11 to 13 and FIG. 15, the anti-ferroelectric layers AFE1, AFE2 and AFE3 may be all formed of hafnium oxide-rich hafnium zirconium oxide. In FIG. 14, all of the anti-ferroelectric layers AFE1, AFE2, AFE3 and AFE4 may be formed of hafnium tetrahydrate-rich hafnium zirconium oxide.

Figure 16A:
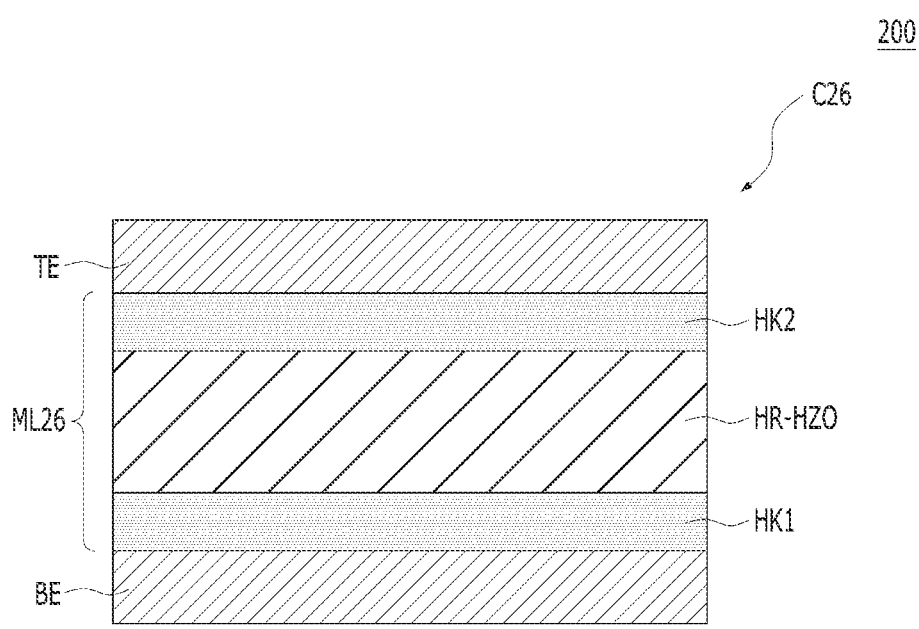
FIG. 16A is a cross-sectional view illustrating a semiconductor device in accordance with another embodiment of the present invention.

FIG. 16A illustrates a semiconductor device in accordance with another embodiment of the present invention.

Referring to FIG. 16A, the semiconductor device 200 may include a capacitor C26. The capacitor C26 may include a first electrode BE, a second electrode TE, and a multi-layer stack ML26 positioned between the first electrode BE and the second electrode TE. The multi-layer stack ML26 may include one hafnium oxide-rich hafnium zirconium oxide layer HR-HZO and at least one high-k dielectric layer HK1 and HK2.

The multi-layer stack ML26 may include a first high-k dielectric layer HK1, a hafnium oxide-rich hafnium zirconium oxide layer HR-HZO, and a second high-k dielectric layer HK2 that are stacked in the mentioned order. The hafnium oxide-rich hafnium zirconium oxide layer HR-HZO may be positioned between the first high-k dielectric layer HK1 and the second high-k dielectric layer HK2. The hafnium oxide-rich hafnium zirconium oxide layer HR-HZO may be thicker than the anti-ferroelectric layers AFE1, AFE2, AFE3 and AFE4 of FIGS. 1 to 15. The hafnium oxide-rich hafnium zirconium oxide layer HR-HZO may be thicker than the first high-k dielectric layer HK1 and the second high-k dielectric layer HK2. The hafnium oxide-rich hafnium zirconium oxide layer HR-HZO may have a thickness of approximately 30 to 100 Å, and it may exhibit ferroelectric.

Referring back to Table 1, when the thickness of the hafnium oxide-rich hafnium zirconium oxide layer HR-HZO is approximately 30 Å or more, the hafnium oxide-rich hafnium zirconium oxide layer HR-HZO may exhibit ferroelectric. The ferroelectric hafnium tetrahydrate-rich hafnium zirconium oxide layer HR-HZO may exert a negative capacitance effect.

The negative capacitance effect may be obtained when a general dielectric material and a ferroelectric material are stacked, and it may refer to an effect of obtaining a greater capacitance than the capacitance of the dielectric material alone. The negative capacitance effect may be implemented in anti-ferroelectric materials and ferroelectric materials, but it may be easier to implement it in the ferroelectric materials than the anti-ferroelectric materials. Therefore, in order to secure ferroelectric characteristics in hafnium zirconium oxide, it is advantageous to have the content of hafnium oxide greater than the content of zirconium oxide.

According to the embodiment of the present invention, the hafnium oxide-rich hafnium zirconium oxide layer HR-HZO may be advantageous for realizing the negative capacitance effect, and accordingly, the capacitance of the capacitor C26 may be further increased by a combination of the hafnium oxide-rich hafnium zirconium oxide layer HR-HZO and the first and second high-k dielectric layers HK1 and HK2. The hafnium oxide-rich hafnium zirconium oxide layer HR-HZO may be referred to as a negative-capacitance material layer or a negative-capacitance ferroelectric material layer.

In order to obtain a negative capacitance effect, according to another embodiment of the present invention, the hafnium oxide-rich hafnium zirconium oxide layer HR-HZO may be replaced with a base hafnium zirconium oxide B-HZO. Referring back to Table 1, the base hafnium zirconium oxide whose hafnium oxide content and zirconium oxide content are the same may exhibit ferroelectric when its thickness is approximately 50 Å or more. Thus, the negative capacitance effect may be obtained.

Figure 16B:
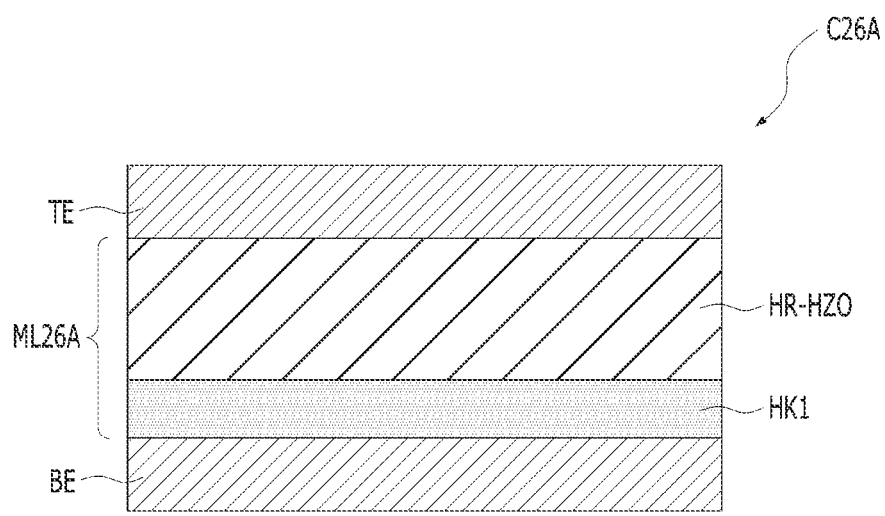
FIGS. 16B to 17C are cross-sectional views illustrating a capacitor in accordance with another embodiment of the present invention.
Figure 16C:
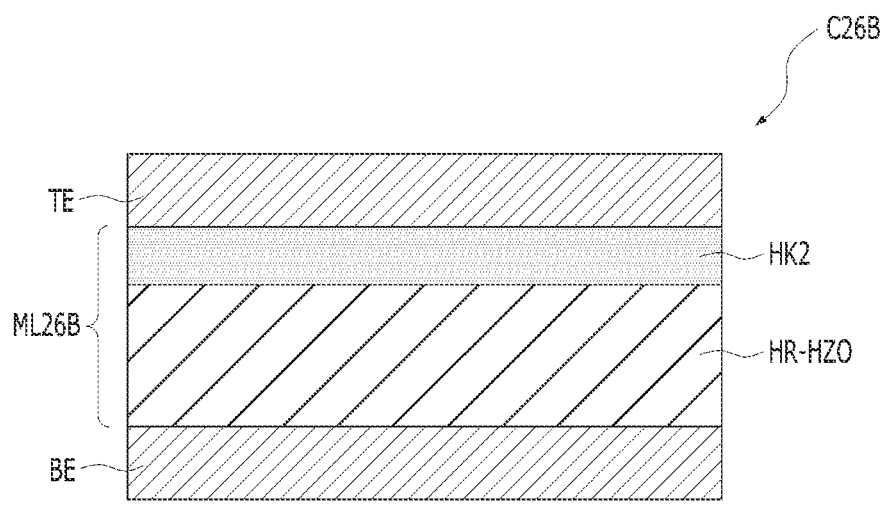

FIGS. 16B and 16C illustrate capacitors in accordance with another embodiment of the present invention, and FIGS. 16B and 16C are modifications of the capacitor C26 shown in FIG. 16A. Hereinafter, detailed description on the constituent elements that also appear through FIGS. 16A and 16C may be omitted.

Referring to FIG. 16B, a capacitor C26A may include a first electrode BE, a second electrode TE, and a multi-layer stack ML26A positioned between the first electrode BE and the second electrode TE. The multi-layer stack ML26A may include one hafnium oxide-rich hafnium zirconium oxide layer HR-HZO and one high-k dielectric layer HK1.

The multi-layer stack ML26A may include a first high-k dielectric layer HK1 and a hafnium oxide-rich hafnium zirconium oxide layer HR-HZO that are stacked in the mentioned order. The first high-k dielectric layer HK1 may directly contact the first electrode BE, and the hafnium oxide-rich hafnium zirconium oxide layer HR-HZO may directly contact the second electrode TE. The hafnium oxide-rich hafnium zirconium oxide layer HR-HZO may be thicker than the first high-k dielectric layer HK1. The hafnium oxide-rich hafnium zirconium oxide layer HR-HZO may have a thickness of approximately 30 to 100 Å, and may exhibit ferroelectric.

Referring to FIG. 16C, a capacitor C26B may include a first electrode BE, a second electrode TE, and a multi-layer stack ML26B positioned between the first electrode BE and the second electrode TE. The multi-layer stack ML26B may include one hafnium oxide-rich hafnium zirconium oxide layer HR-HZO and one high-k dielectric layer HK2.

The multi-layer stack ML26B may include a hafnium oxide-rich hafnium zirconium oxide layer HR-HZO and a second high-k dielectric layer HK2 that are stacked in the mentioned order. The second high-k dielectric layer HK2 may directly contact the second electrode TE, and the hafnium oxide-rich hafnium zirconium oxide layer HR-HZO may directly contact the first electrode BE. The hafnium oxide-rich hafnium zirconium oxide layer HR-HZO may have a thickness of approximately 30 to 100 Å, and may exhibit ferroelectric.

Figure 17A:
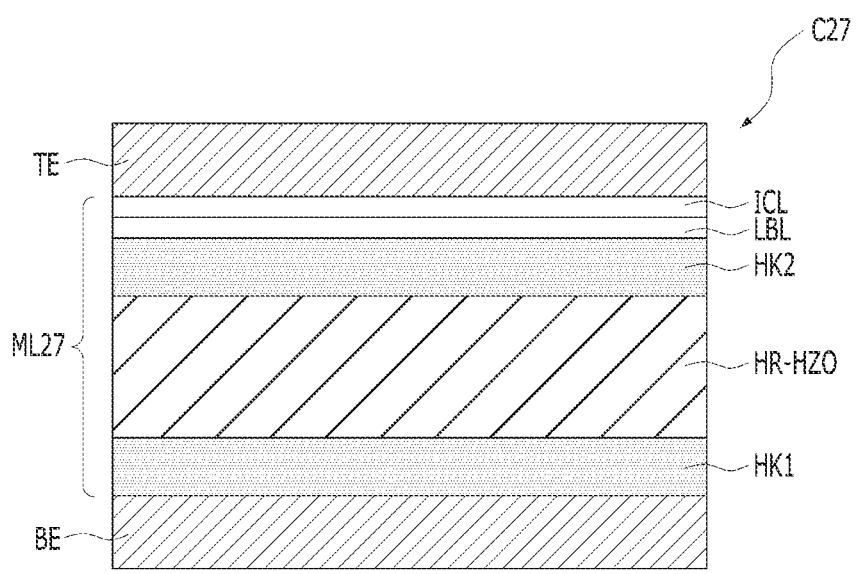

FIG. 17A illustrates a capacitor in accordance with another embodiment of the present invention. A capacitor C27 shown in FIG. 17A may be similar to the capacitor C26 of FIG. 16A. Hereinafter, detailed description on the constituent elements that also appear in FIG. 16A may be omitted.

The capacitor C27 may include a first electrode BE, a second electrode TE, and a multi-layer stack ML27 positioned between the first electrode BE and the second electrode TE. The multi-layer stack ML27 may include one hafnium oxide-rich hafnium zirconium oxide layer HR-HZO and at least one high-k dielectric layer HK1 and HK2. The multi-layer stack ML27 may further include a leakage blocking layer LBL and an interface control layer ICL.

The multi-layer stack ML27 may include a first high-k dielectric layer HK1, a hafnium oxide-rich hafnium zirconium oxide layer HR-HZO, a second high-k dielectric layer HK2, a leakage blocking layer LBL, and an interface control layer ICL. The hafnium oxide-rich hafnium zirconium oxide layer HR-HZO may be positioned between the first high-k dielectric layer HK1 and the second high-k dielectric layer HK2. A negative capacitance effect may be obtained by the hafnium oxide-rich hafnium zirconium oxide layer HR-HZO.

The leakage blocking layer LBL and the interface control layer ICL may be positioned between the second high-k dielectric layer HK2 and the second electrode TE. The leakage blocking layer LBL may be positioned between the second high-k dielectric layer HK2 and the interface control layer ICL. The interface control layer ICL may be positioned between the leakage blocking layer LBL and the second electrode TE. As for the description on the leakage blocking layer LBL and the interface control layer ICL, FIG. 2 and the accompanying description may be referred to.

Figure 17B:
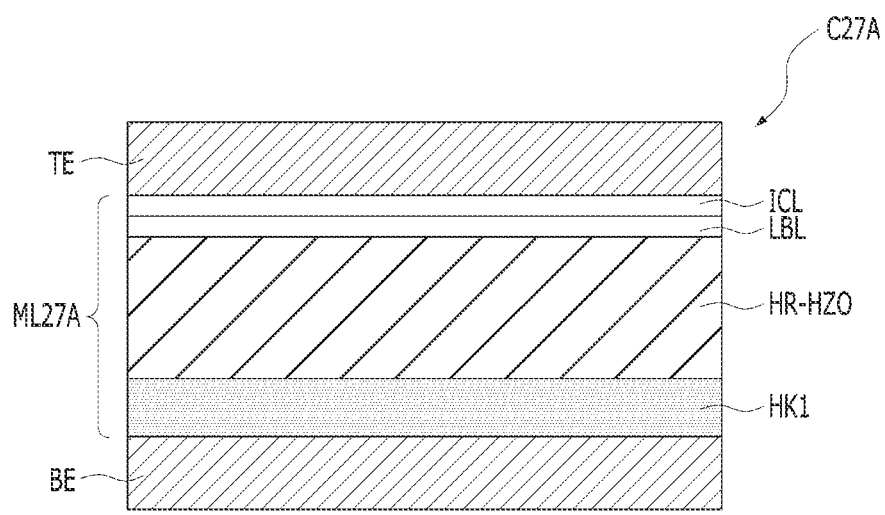
Figure 17C:
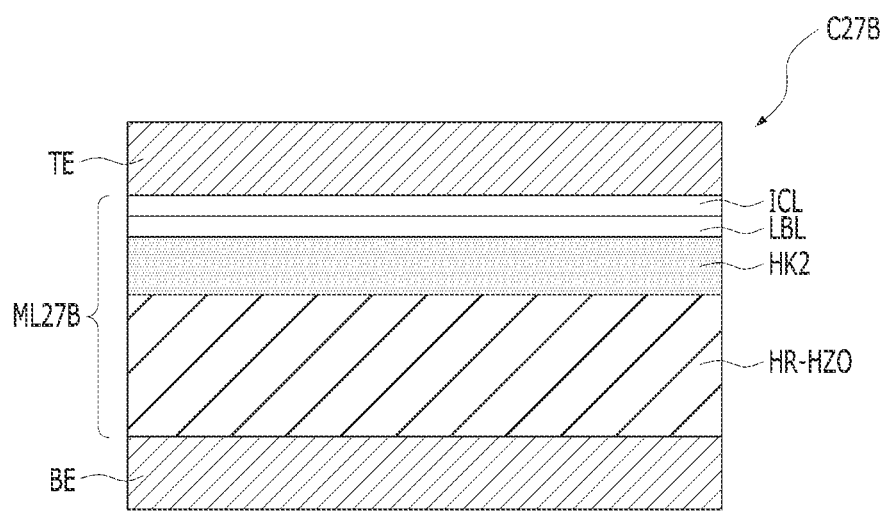

FIGS. 17B and 17C illustrate a capacitor in accordance with another embodiment of the present invention, and FIGS. 17B and 17C are modifications of the capacitor C27 shown in FIG. 17A. Hereinafter, detailed description on the constituent elements that also appear in FIG. 17A may be omitted.

Referring to FIG. 17B, a capacitor C27A may include a first electrode BE, a second electrode TE, and a multi-layer stack ML27A positioned between the first electrode BE and the second electrode TE. The multi-layer stack ML27A may include one hafnium oxide-rich hafnium zirconium oxide layer HR-HZO and one high-k dielectric layer HK1. The multi-layer stack ML27A may further include a leakage blocking layer LBL and an interface control layer ICL.

The multi-layer stack ML27A may be stacked in the order of a first high-k dielectric layer HK1, a hafnium oxide-rich hafnium zirconium oxide layer HR-HZO, a leakage blocking layer LBL and an interface control layer ICL that are stacked in the mentioned order. The hafnium oxide-rich hafnium zirconium oxide layer HR-HZO may be positioned between the first high-k dielectric layer HK1 and the leakage blocking layer LBL.

Referring to FIG. 17C, a capacitor C27B may include a first electrode BE, a second electrode TE, and a multi-layer stack ML27B positioned between the first electrode BE and the second electrode TE. The multi-layer stack ML27B may include one hafnium oxide-rich hafnium zirconium oxide layer HR-HZO and one high-k dielectric layer HK2. The multi-layer stack ML27B may further include a leakage blocking layer LBL and an interface control layer ICL.

The multi-layer stack ML27B may include a hafnium oxide-rich hafnium zirconium oxide layer HR-HZO and a second high-k dielectric layer HK2, a leakage blocking layer LBL, and an interface control layer ICL that are stacked in the mentioned order. The hafnium oxide-rich hafnium zirconium oxide layer HR-HZO may be positioned between the first electrode BE and the second high-k dielectric layer HK2.

According to another embodiment of the present invention, the multi-layer stack ML26, ML26A, ML26B, ML27A, ML27A and ML27B may be formed by alternately stacking a plurality of negative capacitance material layers (e.g., a hafnium oxide-rich hafnium zirconium oxide layer) and a plurality of high-k dielectric layers. In this case, the negative capacitance material layers may be thicker than the high-k dielectric layers.

The thickness of the hafnium oxide-rich hafnium zirconium oxide layer HR-HZO of FIGS. 16A to 17C and the thickness of the anti-ferroelectric layers AFE1, AFE2, AFE3 and AFE4 of FIGS. 1 to 15 may be different from each other. The anti-ferroelectric layers AFE1, AFE2, AFE3 and AFE4 of FIGS. 1 to 15 may have a thickness of approximately 50 Å or less, and the hafnium oxide-rich hafnium zirconium oxide layer HR-HZO of FIGS. 16A to 17C may have a thickness of approximately 30 to 100 Å. The thickness of the hafnium oxide-rich hafnium zirconium oxide layer HR-HZO of FIGS. 16A to 17C may be thicker than that of the anti-ferroelectric layers AFE1, AFE2, AFE3 and AFE4 of FIGS. 1 to 15.

According to another embodiment of the present invention, when the anti-ferroelectric layers AFE1, AFE2, AFE3 and AFE4 of FIGS. 1 to 15 include a hafnium oxide-rich hafnium zirconium oxide layer, the negative capacitance effect may be obtained.

Referring to FIGS. 1 to 17C, the multi-layer stacks ML11 to ML27B may have the same height (or thickness).

Figure 18:
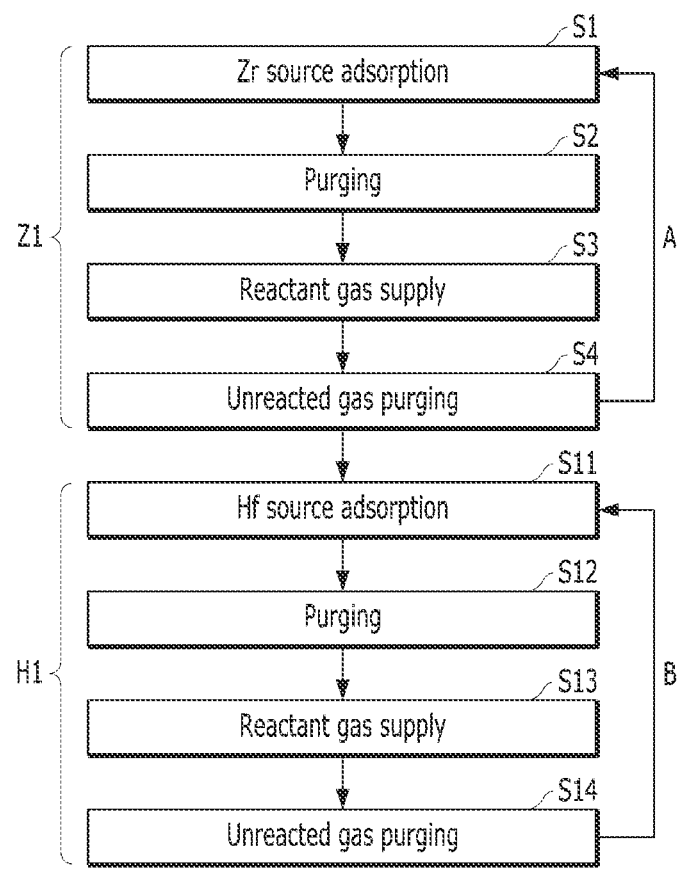
FIG. 18 is a flowchart describing an example of a method for depositing a hafnium oxide-rich hafnium zirconium oxide layer.

FIG. 18 is a flowchart describing an example of a method for depositing a hafnium oxide-rich hafnium zirconium oxide layer HR-HZO.

The hafnium oxide-rich hafnium zirconium oxide layer HR-HZO may be deposited by atomic layer deposition (ALD). The atomic layer deposition (ALD) of the hafnium oxide-rich hafnium zirconium oxide layer HR-HZO may be performed by repeating a plurality of cycles at a temperature of approximately 250° C. to 380° C. Here, the cycles may include a first cycle Z1 for depositing a zirconium oxide layer ($ZrO_2$) and a second cycle H1 for depositing a hafnium oxide layer ($HfO_2$). The zirconium oxide layer may be deposited by repeating the first cycle Z1 A times, and the hafnium oxide layer may be deposited by repeating the second cycle H1 B times. Here, A and B may be different natural numbers. B may be greater than A. For example, A may range from 1 to 10, and B may be greater than 10. The hafnium oxide layer may be deposited thicker than the zirconium oxide layer by making B greater than A, and accordingly, the hafnium oxide-rich hafnium zirconium oxide layer HR-HZO may be deposited.

The first cycle Z1 may include a Zr source adsorption operation (S1), a purging operation (S2), a reaction gas supply operation (S3), and an unreacted gas purging operation (S4). The first cycle (Z1) may be repeated A times. The zirconium oxide layer may be deposited in the first cycle Z1.

The second cycle H1 may include a hafnium (Hf) source adsorption operation (S11), a purging operation (S12), a reaction gas supply operation (S13), and an unreacted gas purging operation (S14). The second cycle H1 may be repeated B times. The hafnium oxide layer may be deposited in the second cycle H1.

The zirconium (Zr) source may include TEMAZ (Tetrakis EthylMethylAmino Zirconium), TDMAZ (Tetrakis DiMethylAmino Zirconium), and the like.

The hafnium (Hf) source may include TEMAH (Tetrakis EthylMethylAmino Hafnium), TDEAH (Tetrakis DiEthylAmino Hafnium), TDMAH (Tetrakis DiMethylAmino Hafnium), and the like.

The reaction gas may include an oxidizing agent, and the oxidizing agent may include $O_3$, $O_2$, $H_2O$, $H_2O_2$, $O_2$ plasma, or a combination thereof. When ozone ($O_3$) is used as an oxidizing agent, the concentration and flow rate of ozone may be optimized and supplied. For example, the concentration of ozone may range from approximately 50 $g/m^3$ to 310 $g/m^3$, and the flow rate of ozone may range from approximately 100 sccm to 5000 sccm. The purging operation may be sufficiently long in the range of approximately 1 second to 100 seconds.

According to another embodiment of the present invention, the hafnium oxide-rich hafnium zirconium oxide layer HR-HZO may be deposited by making A and B the same and making the flow rate of the hafnium (Hf) source greater than the flow rate of the zirconium (Zr) source.

According to another embodiment of the present invention, the hafnium oxide-rich hafnium zirconium oxide layer HR-HZO may be deposited by making A and B the same and making the supply time of the hafnium (Hf) source longer than the supply time of the zirconium (Zr) source.

In order to obtain anti-ferroelectric, a hafnium oxide-rich hafnium zirconium oxide layer HR-HZO may be deposited in a thickness thinner than approximately 30 Å.

In order to obtain ferroelectric, a hafnium oxide-rich hafnium zirconium oxide layer HR-HZO may be deposited to a thickness of approximately 30 Å or more.

After the atomic layer deposition of the hafnium oxide-rich hafnium zirconium oxide layer HR-HZO is performed, the hafnium oxide-rich hafnium zirconium oxide layer HR-HZO may be exposed to a subsequent annealing process. The crystallinity of the hafnium oxide-rich hafnium zirconium oxide layer HR-HZO may be improved by the subsequent annealing process, thereby increasing the dielectric constant.

Figure 19:
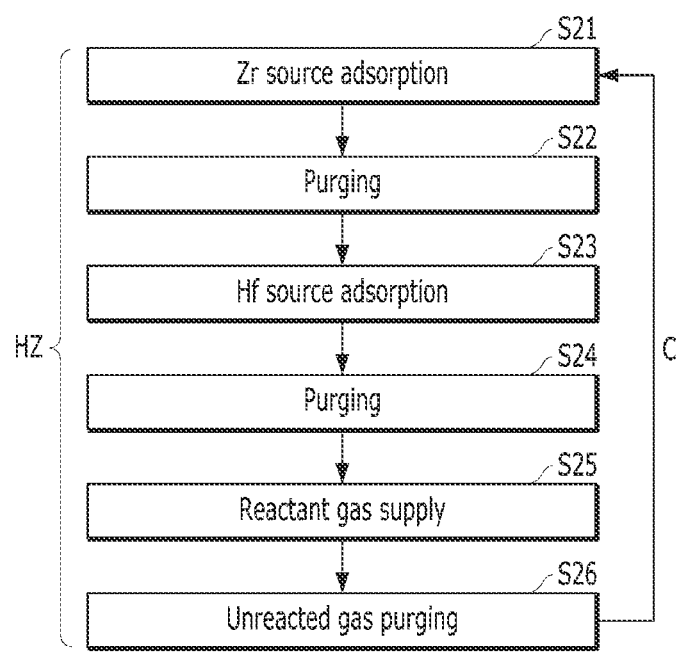
FIG. 19 is a flowchart describing another example of the method for depositing a hafnium oxide-rich hafnium zirconium oxide layer.

FIG. 19 is a flowchart describing another example of the method for depositing a hafnium oxide-rich hafnium zirconium oxide layer HR-HZO.

The hafnium oxide-rich hafnium zirconium oxide layer HR-HZO may be deposited by atomic layer deposition (ALD), and the atomic layer deposition (ALD) of the hafnium oxide-rich hafnium zirconium oxide layer HR-HZO may be performed at approximately 250° C. to 380° C. by repeating a unit cycle HZ. Here, the unit cycle HZ may include a zirconium (Zr) source adsorption operation (S21), a purging operation (S22), a hafnium (Hf) source adsorption operation (S23), a purging operation (S24), a reactant gas supply operation (S25), an unreacted gas purging operation (S26), and the unit cycle HZ may be repeated C times.

The zirconium (Zr) source may include TEMAZ (Tetrakis EthylMethylAmino Zirconium), TDMAZ (Tetrakis DiMethylAmino Zirconium), and the like.

The hafnium (Hf) source may include TEMAH (Tetrakis EthylMethylAmino Hafnium), TDEAH (Tetrakis DiEthylAmino Hafnium), TDMAH (Tetrakis DiMethylAmino Hafnium), and the like.

The reaction gas may include an oxidizing agent, and the oxidizing agent may include $O_3$, $O_2$, $H_2O$, $H_2O_2$, $O_2$ plasma, or a combination thereof. When ozone ($O_3$) is used as an oxidizing agent, the concentration and flow rate of ozone may be optimized and supplied. For example, the concentration of ozone may range from approximately 50 g/m$^3$ to 310 g/m$^3$, and the flow rate of ozone may range from approximately 100 sccm to 5000 sccm. The purging operation of any unreacted gas may be sufficiently long and may, for example, range from approximately 1 second to 100 seconds.

In a unit cycle HZ, a hafnium oxide-rich hafnium zirconium oxide layer HR-HZO may be deposited by making the flow rate of the hafnium (Hf) source greater than that of the zirconium (Zr) source. According to another embodiment of the present invention, a hafnium oxide-rich hafnium zirconium oxide layer HR-HZO may be deposited making the supply time of the hafnium (Hf) source longer than the supply time of the zirconium (Zr) source.

After the atomic layer deposition of the hafnium oxide-rich hafnium zirconium oxide layer HR-HZO is performed, the hafnium oxide-rich hafnium zirconium oxide layer HR-HZO may be exposed to a subsequent annealing process. The crystallinity of the hafnium oxide-rich hafnium zirconium oxide layer HR-HZO may be improved by the subsequent annealing process.

Figure 20:
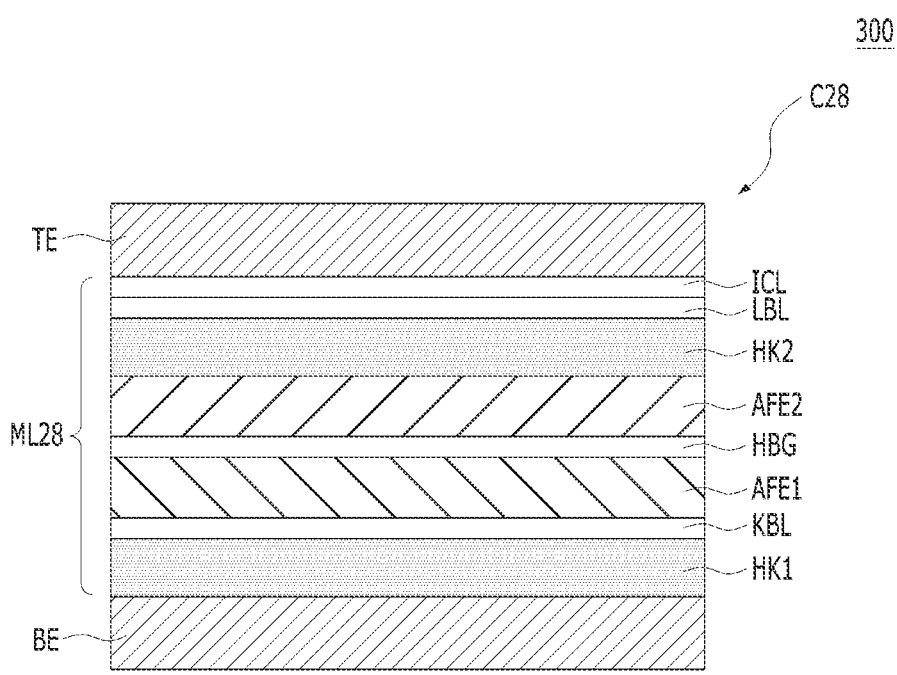
FIG. 20 is a cross-sectional view illustrating a semiconductor device in accordance with another embodiment of the present invention.

FIG. 20 is a cross-sectional view illustrating a semiconductor device 300 in accordance with another embodiment of the present invention.

Referring to FIG. 20, the semiconductor device 300 may include a capacitor C28. The capacitor C28 may include a first electrode BE, a second electrode TE, and a multi-layer stack ML28 positioned between the first electrode BE and the second electrode TE. The multi-layer stack ML28 may include at least one anti-ferroelectric layer AFE1 and AFE2 and at least one high-k dielectric layer HK1 and HK2. The multi-layer stack ML28 may further include a leakage blocking layer LBL and an interface control layer ICL. According to another embodiment of the present invention, the leakage blocking layer LBL and the interface control layer ICL of the multi-layer stack ML28 may be omitted. The capacitor C28 may be similar to the capacitor C12 of FIG. 2. Hereinafter, detailed description on the constituent elements that also appear in FIG. 2 may be omitted.

The multi-layer stack ML28 may further include a booster layer KBL. The booster layer KBL may directly contact the first anti-ferroelectric layer AFE1. The booster layer KBL may be formed below the first anti-ferroelectric layer AFE1. The booster layer KBL may be positioned between the first high-k dielectric layer HK1 and the first anti-ferroelectric layer AFE1. The booster layer KBL may directly contact the first high-k dielectric layer HK1.

The booster layer KBL may boost the dielectric constant of the first anti-ferroelectric layer AFE1. In other words, the booster layer KBL may be used as a dielectric constant booster (which may be called a k-booster). The booster layer KBL may increase the dielectric constant of the first anti-ferroelectric layer AFE1. The booster layer KBL may also serve as a polarization enhancement layer that enhances the polarization of the first anti-ferroelectric layer AFE1. The enhanced polarization may further increase the dielectric constant of the first anti-ferroelectric layer AFE1.

The booster layer KBL may be made of or include a metal. The metal of the booster layer KBL may include a bivalent metal, a trivalent metal, or a pentavalent metal. The bivalent metal and the trivalent metal may have high electron affinity.

The booster layer KBL may contain a metal. The booster layer KBL may include at least one selected from niobium, tantalum, and vanadium. The booster layer KBL may be made of or include a metal oxide. According to another embodiment of the present invention, the booster layer KBL may be a metal oxynitride. The booster layer KBL may include niobium oxide, niobium oxynitride, tantalum oxide, tantalum oxynitride, vanadium oxide, or vanadium oxynitride.

As described above, the booster layer KBL may contain a metal and oxygen. Also, the booster layer KBL may contain a metal, oxygen, and nitrogen. To boost the dielectric constant of the first anti-ferroelectric layer AFE1, the oxygen content and nitrogen content of the booster layer KBL may be adjusted. For example, when the booster layer KBL contains a metal oxide, the oxygen content may be adjusted within a range of approximately 1 to 50 at %. When the booster layer KBL contains a metal oxynitride, the oxygen content may be greater than the nitrogen content, and the total content of oxygen and nitrogen may range from approximately 60 to 70 at %. It is advantageous to boost the dielectric constant of the first anti-ferroelectric layer AFE1 by controlling the oxygen content of the booster layer KBL.

The booster layer KBL may have a thickness of approximately 0.1 Å to 5 Å.

According to another embodiment of the present invention, the booster layer KBL may also be positioned below the second anti-ferroelectric layer AFE2.

According to another embodiment of the present invention, the booster layer KBL may be positioned below one anti-ferroelectric layer among the first anti-ferroelectric layer AFE1 and the second anti-ferroelectric layer AFE2.

Referring to FIGS. 1 to 17C, multi-layer stacks may include at least one booster layer KBL. The booster layer KBL may be positioned below the anti-ferroelectric layer AFE1, AFE2, AFE3 and AFE4 or hafnium-rich hafnium zirconium oxide layer HR-HZO.

Figure 21:
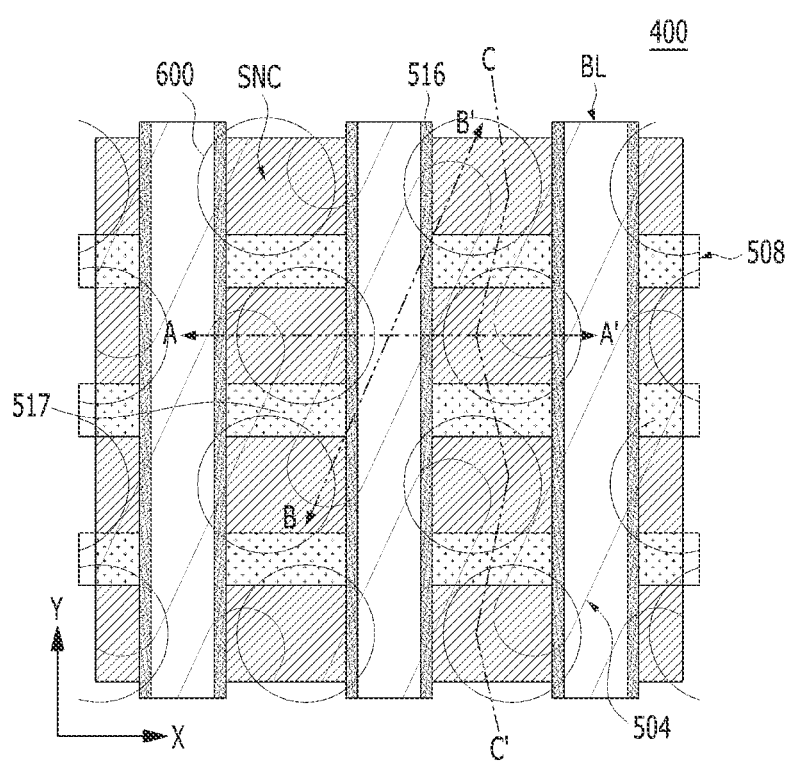
FIGS. 21 to 22B are cross-sectional views illustrating memory cells.
Figure 22A:
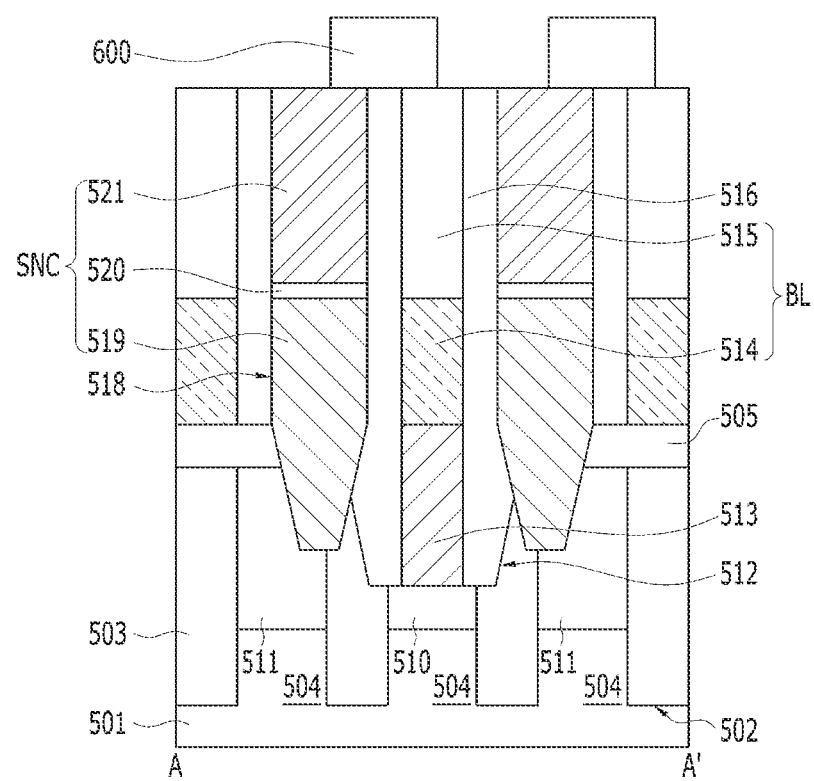
Figure 22B:
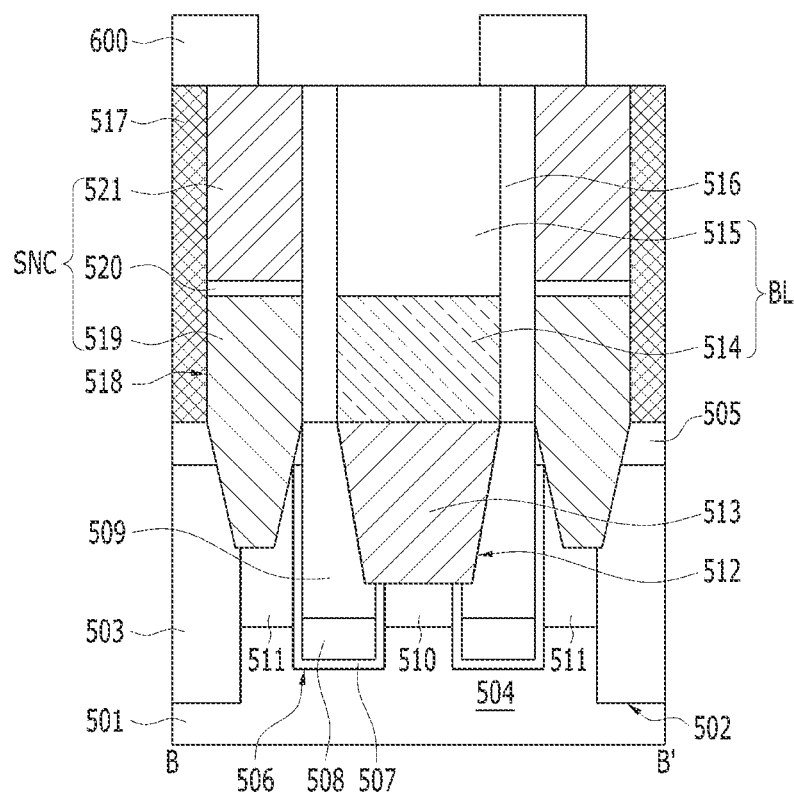

FIGS. 21 to 22B are cross-sectional views illustrating memory cells. FIG. 22A is a cross-sectional view taken along a line A-A' in FIG. 21. FIG. 22B is a cross-sectional view taken along a line B-B' in FIG. 21.

The memory cell 400 may include a cell transistor including a buried word line 508, a bit line 514, and a capacitor 600. The capacitor 600 may include a multi-layer stack, and the multi-layer stack may include one among the multi-layer stacks ML11 to ML28 in the above-described embodiments of the present invention.

The memory cell 400 may be described in detail.

The isolation layer 503 and the active region 504 may be formed in the substrate 501. A plurality of active regions 504 may be defined by the isolation layer 503. The substrate 501 may be made of a material suitable for semiconductor processing. The substrate 501 may include a semiconductor substrate. The substrate 501 may be formed of a material containing silicon. The substrate 501 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 501 may also include other semiconductor materials such as germanium. The substrate 501 may include a group-III/V semiconductor substrate, such as a compound semiconductor substrate, e.g., GaAs. The substrate 501 may include a silicon on insulator (SOI) substrate. The isolation layer 503 may be formed in an isolation trench 502 by a Shallow Trench Isolation (STI) process.

A word line trench 506 may be formed in the substrate 501. The word line trench 506 may be referred to as a gate trench. A gate dielectric layer 507 may be formed on the surface of the word line trench 506. A buried word line 508 partially filling the word line trench 506 may be formed over the gate dielectric layer 507. The buried word line 508 may be referred to as a buried gate electrode. A word line capping layer 509 may be formed over the buried word line 508. The upper surface of the buried word line 508 may be positioned at a lower level than the surface of the substrate 501. The buried word line 508 may be a low resistance metal material. The buried word line 508 may be formed by sequentially stacking titanium nitride and tungsten. According to another embodiment of the present invention, the buried word line 508 may be formed of titanium nitride only (TiN only).

First and second impurity regions 510 and 511 may be formed in the substrate 501. The first and second impurity regions 510 and 511 may be spaced apart from each other by the word line trench 506. The first and second impurity regions 510 and 511 may be referred to as first and second source/drain regions. The first and second impurity regions 510 and 511 may include N-type impurities, such as arsenic (As) or phosphorus (P). Accordingly, the buried word line 508 and the first and second impurity regions 510 and 511 may become cell transistors. The buried word line 508 may improve the short channel effect of the cell transistor.

A bit line contact plug 513 may be formed over the substrate 501. The bit line contact plug 513 may be coupled to the first impurity region 510. The bit line contact plug 513 may be positioned in the bit line contact hole 512. The bit line contact hole 512 may be formed in a hard mask layer 505. The hard mask layer 505 may be formed over the substrate 501. The bit line contact hole 512 may expose the first impurity region 510. The lower surface of the bit line contact plug 513 may be lower than the upper surface of the substrate 501. The bit line contact plug 513 may be formed of polysilicon or a metal material. A portion of the bit line contact plug 513 may have a line width smaller than the diameter of the bit line contact hole 512. A bit line 514 may be formed over the bit line contact plug 513. A bit line hard mask 515 may be formed over the bit line 514. The stacked structure of the bit line 514 and the bit line hard mask 514 may be referred to as a bit line structure BL. The bit line 514 may have a shape of a line extending in a direction intersecting with the buried word line 508. A portion of the bit line 514 may be coupled to the bit line contact plug 513. The bit line 514 may be made of or include a metal material. The bit line hard mask 515 may include a dielectric material.

A bit line spacer 516 may be formed on a sidewall of a bit line structure BL. The bottom portion of the bit line spacer 516 may extend to be formed on both sides of the bit line contact plug 513. The bit line spacer 516 may include silicon oxide, silicon nitride, or a combination thereof. According to another embodiment of the present invention, the bit line spacer 516 may include an air gap. For example, it may be a NAN (Nitride-Air gap-Nitride) structure in which an air gap is positioned between silicon nitrides.

A storage node contact plug SNC may be formed between the neighboring bit line structures BL. The storage node contact plug SNC may be formed in the storage node contact hole 518. The storage node contact plug SNC may be coupled to the second impurity region 511. The storage node contact plug SNC may include a lower plug 519 and an upper plug 521. The storage node contact plug SNC may further include an ohmic contact layer 520 between the lower plug 519 and the upper plug 521. The ohmic contact layer 520 may be made of or include a metal silicide. The upper plug 521 may be made of or include a metal material, and the lower plug 519 may include a silicon-containing material.

From the perspective of a direction parallel to the bit line structure BL (direction of a line C-C' in FIG. 21), a plug isolation layer 517 may be formed between the neighboring storage node contact plugs SNC. The plug isolation layer 517 may be formed between the neighboring bit line structures BL and may provide a storage node contact hole 518 together with the hard mask layer 505.

The capacitor 600 may be coupled to a storage node contact plug SNC.

FIGS. 23A to 23F are cross-sectional views illustrating applications of a capacitor 600 of a memory cell.

Figure 23A:
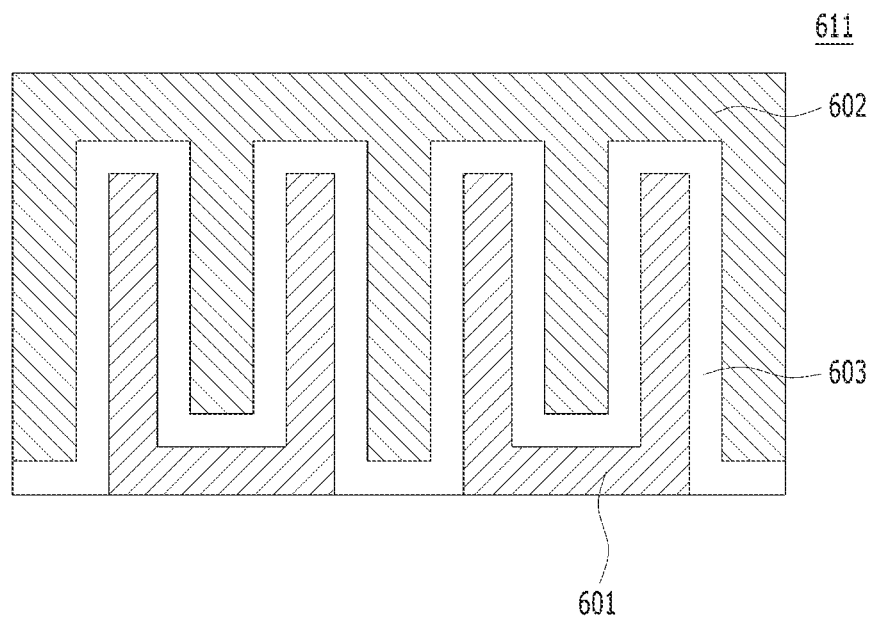
FIGS. 23A to 23F are cross-sectional views illustrating applications of a capacitor 600 of a memory cell.

Referring to FIG. 23A, the capacitor 611 may include a bottom electrode 601, a top electrode 602, and a multi-layer stack 603 between the bottom electrode 601 and the top electrode 602. The bottom electrode 601 may have a cylinder shape. The multi-layer stack 603 may be formed over the bottom electrode 601, and the top electrode 602 may be formed over the multi-layer stack 603. The multi-layer stack 603 may correspond to one among the multi-layer stacks ML11 to ML28 in the above-described embodiments of the present invention. Accordingly, the multi-layer stack 603 may include at least one anti-ferroelectric layer.

Hereinafter, detailed description on the constituent elements that also appear in FIG. 23A may be omitted in FIGS. 23B to 23F.

Figure 23B:
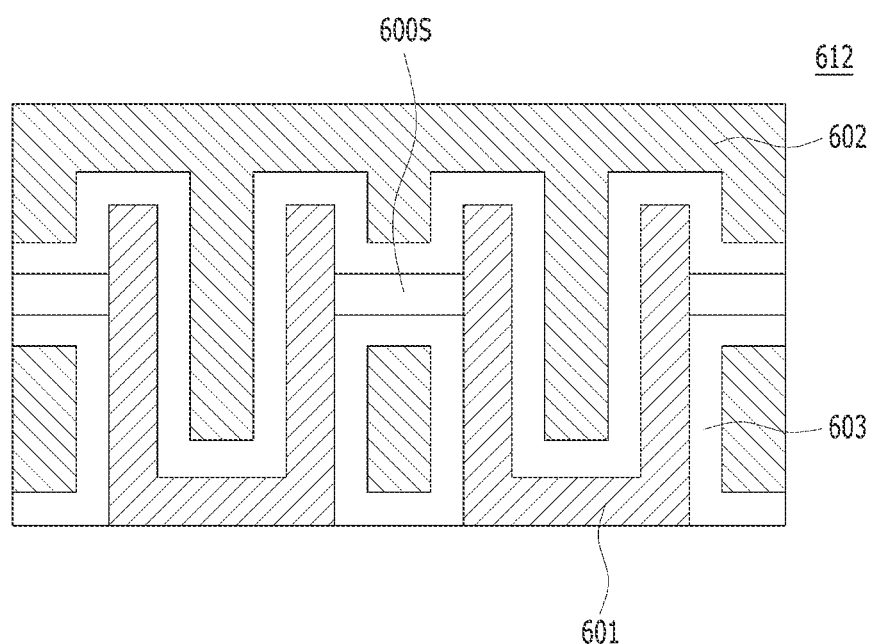

Referring to FIG. 23B, a capacitor 612 may include a cylinder-shaped bottom electrode 601, a multi-layer stack 603, and a top electrode 602. The capacitor 612 may further include a supporter 600S. The supporter 600S may be a structure that supports the outer wall of the bottom electrode 601. The supporter 600S may include silicon nitride.

Figure 23C:
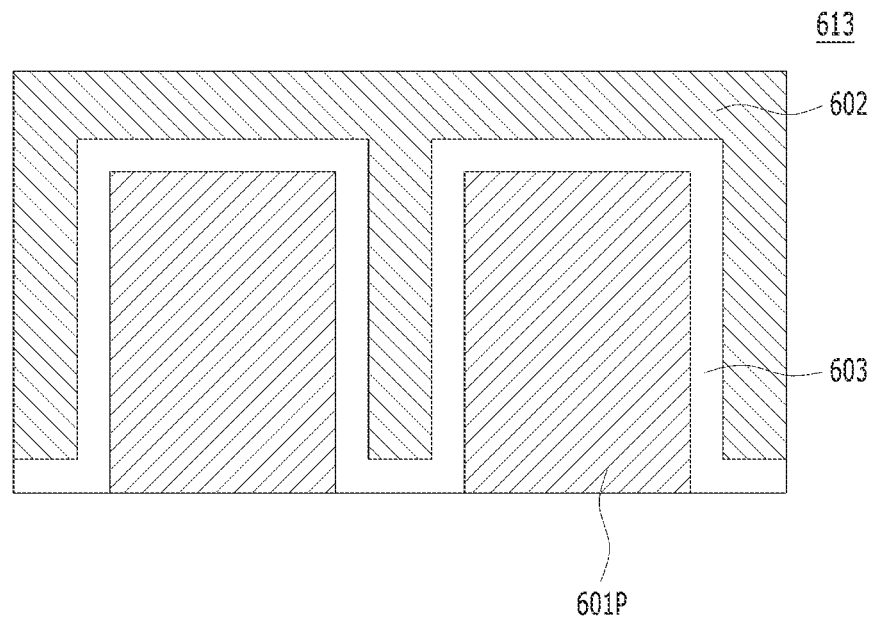
Figure 23D:
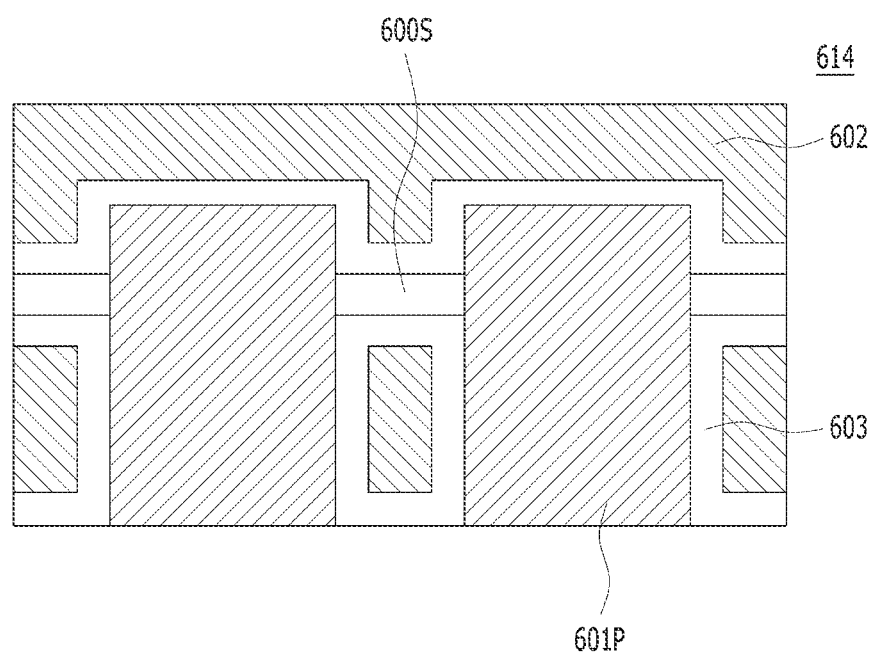

Referring to FIGS. 23C and 23D, the capacitors 613 and 614 may include a pillar-shaped bottom electrode 601P, the multi-layer stack 603, and the top electrode 602. The capacitor 614 of FIG. 23D may further include a supporter 600S.

Figure 23E:
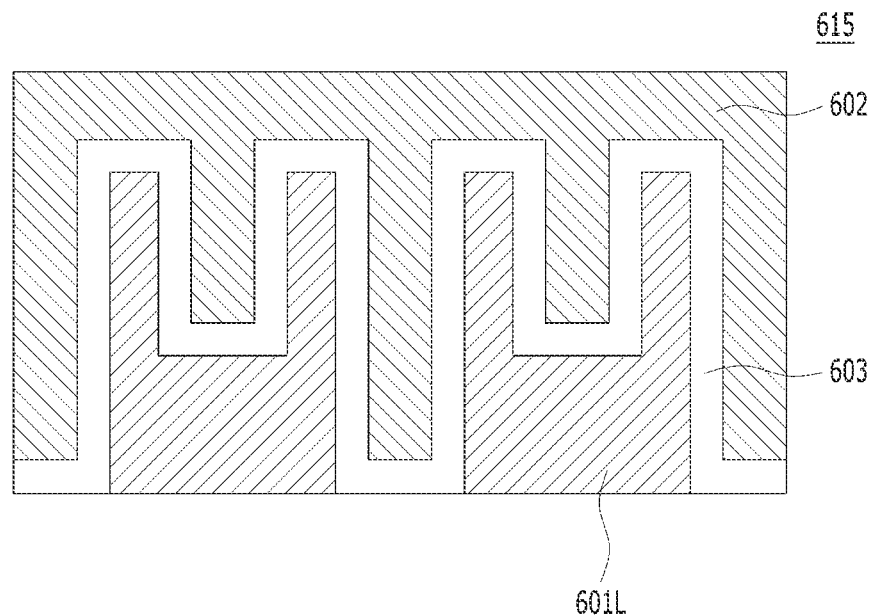
Figure 23F:
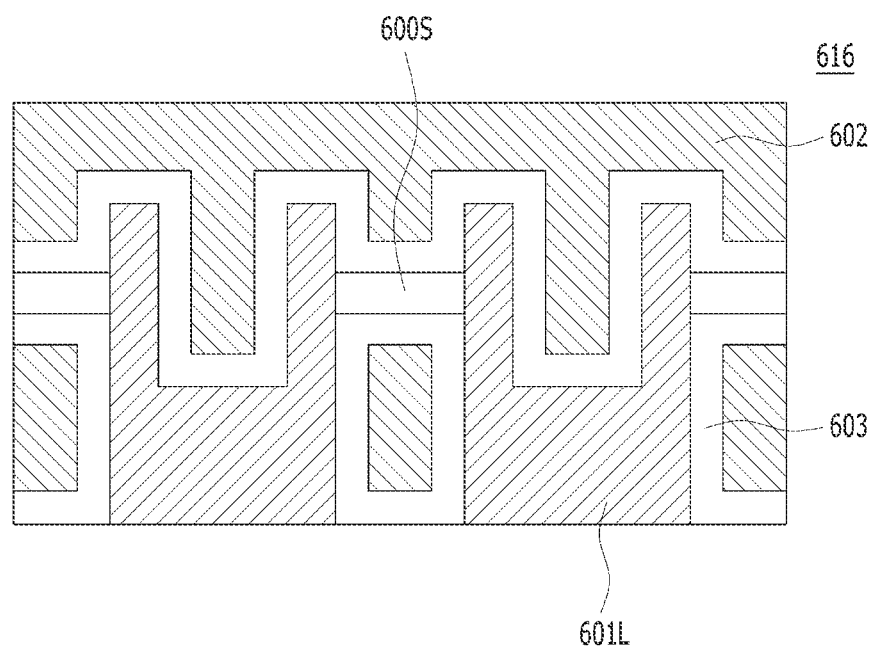

Referring to FIGS. 23E and 23F, the capacitors 615 and 616 may include bottom electrode 601L, the multi-layer stack 603, and the top electrode 602. The capacitor 616 of FIG. 23F may further include a supporter 600S. The bottom electrode 601L may have a hybrid structure in which a pillar shape and a cylinder shape are merged. As described above, the hybrid structure of a pillar shape and a cylinder shape may be referred to as a pylinder or a hybrid shape.

As described above, by forming the multi-layer stack 603 to include at least one anti-ferroelectric layer, a multi-layer stack 603 having a high dielectric constant and a low leakage current may be obtained. Accordingly, a highly integrated DRAM memory cell with improved refresh characteristics and reliability may be fabricated.

The dielectric layer stack in accordance with the above-described embodiments of the present invention may be applied to a peripheral circuit of a DRAM. For example, the DRAM may include a memory cell region including a memory cell (see 400 in FIG. 22A) and a peripheral circuit region including a peripheral transistor. At least one among the capacitor 600 of the memory cell 400 and the peripheral transistor may include one multi-layer stack among the multi-layer stacks ML11 to ML28 of the above-described embodiments of the present invention.

The multi-layer stack ML11 to ML28 in accordance with the above-described embodiments of the present invention may be applied to a metal-insulator-metal (MIM) capacitor. For example, the MIM capacitor may include a multi-layer stack including a first metal electrode, a second metal electrode, and at least one anti-ferroelectric layer formed between the first metal electrode and the second metal electrode.

The multi-layer stack in accordance with the above-described embodiments of the present invention may be applied to an embedded DRAM. For example, the embedded DRAM may include a logic circuit and an embedded DRAM, and the capacitor of the embedded DRAM may include a multi-layer stack including at least one anti-ferroelectric layer.

The multi-layer stack in accordance with the above-described embodiments of the present invention may be applied to a three-dimensional (3D) NAND. For example, the 3D NAND may include a pillar-shaped channel layer, a word line surrounding the pillar-shaped channel layer, and a multi-layer stack including at least one anti-ferroelectric layer between the pillar-shaped channel layer and the word line.

Figure 24:
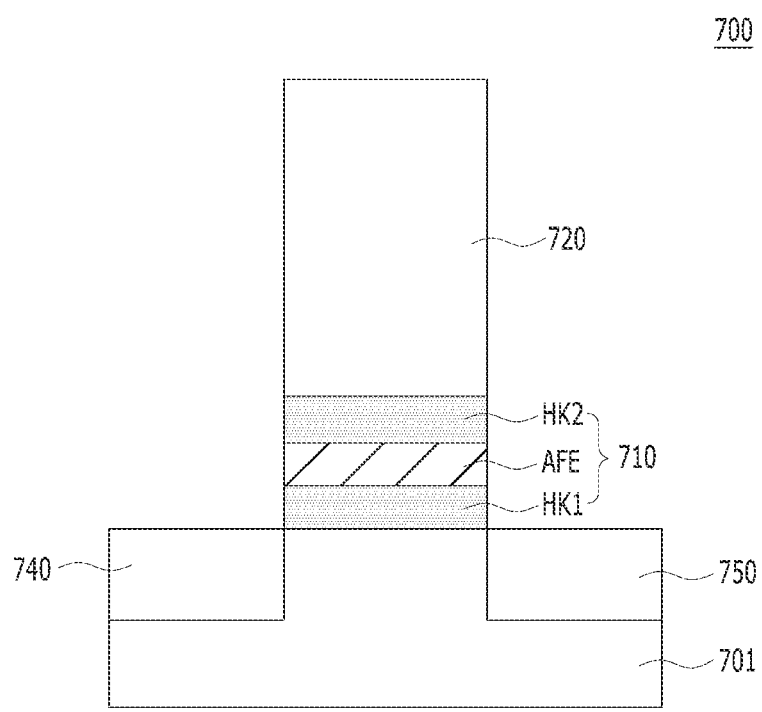
FIG. 24 is a cross-sectional view illustrating a semiconductor device in accordance with another embodiment of the present invention.

FIG. 24 is a cross-sectional view illustrating a semiconductor device in accordance with another embodiment of the present invention.

Referring to FIG. 24, the semiconductor device 700 may include a transistor. The semiconductor device 700 may include a semiconductor substrate 701, a gate dielectric layer 710, a gate electrode 720, a source region 740, and a drain region 750. The gate dielectric layer 710 may be formed over the semiconductor substrate 701, and the gate electrode 720 may be formed over the gate dielectric layer 710. The source region 740 and the drain region 750 may be formed in the semiconductor substrate 701.

The gate dielectric layer 710 may include one of multi-layer stacks according to the above-described embodiments. The gate dielectric layer 710 may include at least one anti-ferroelectric layer and at least one high-k dielectric layer. According to the embodiment of FIG. 24, the gate dielectric layer 710 may include a first high-k dielectric layer HK1, an anti-ferroelectric layer AFE, and a second high-k dielectric layer HK2 that are stacked in the mentioned order. The anti-ferroelectric layer AFE may be positioned between the first high-k dielectric layer HK1 and the second high-k dielectric layer HK2.

The gate electrode 720 may be a metal gate electrode including a metal-based material. The gate electrode 720 may be made of or include, for example, tungsten, aluminum, tungsten nitride, titanium nitride, titanium, or a combination thereof.

The source region 740 and the drain region 750 may include an impurity of the same conductivity type. The source region 740 and the drain region 750 may include an N-type impurity or a P-type impurity. The N-type impurity may include phosphorus or arsenic, and the P-type impurity may include boron or indium.

According to another embodiment of the present invention, a thin interface layer may be further formed between the gate dielectric layer 710 and the semiconductor substrate 701. Here, the thin interface layer may include silicon oxide or silicon oxynitride.

According to another embodiment of the present invention, the gate dielectric layer 710 may be applied to a gate dielectric layer of FinFET.

According to another embodiment of the present invention, the gate dielectric layer 710 may include a hafnium oxide-rich hafnium zirconium oxide to obtain a negative capacitance effect. For example, the anti-ferroelectric layer AFE may be replaced with a hafnium oxide-rich hafnium zirconium oxide.

Figure 25:
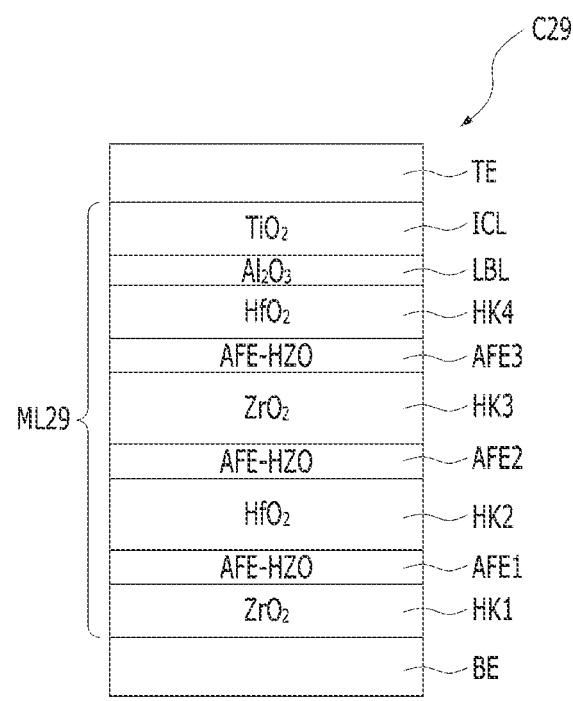
FIGS. 25 to 27 are cross-sectional views illustrating capacitors in accordance with other embodiments of the present invention.
Figure 26:
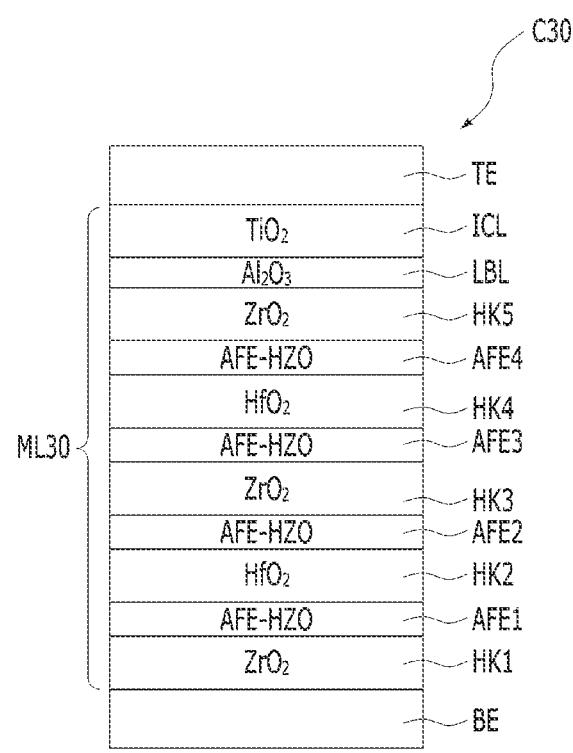
Figure 27:
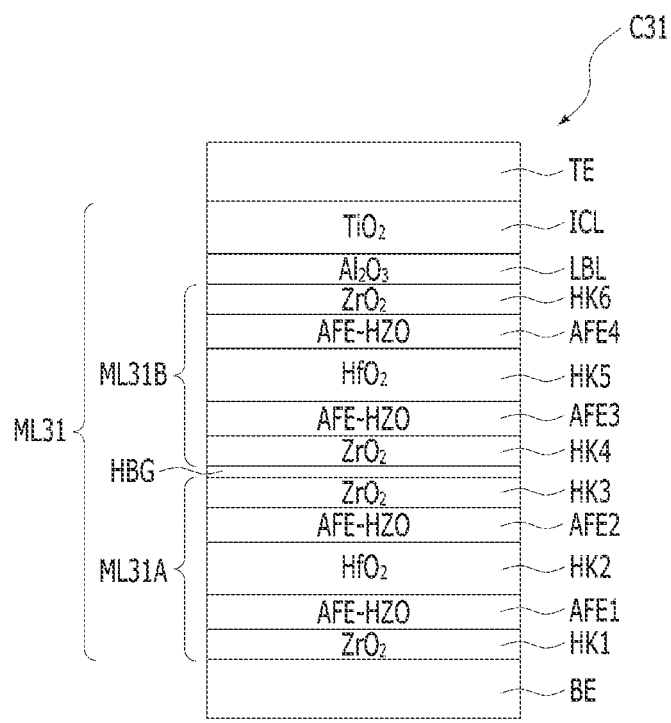

FIGS. 25 to 27 are cross-sectional views illustrating capacitors in accordance with other embodiments of the present invention.

Referring to FIG. 25, the capacitor C29 may include a first electrode BE, a second electrode TE, and a multi-layer stack ML29 between the first electrode BE and the second electrode TE. The multi-layer stack ML29 may include at least one anti-ferroelectric layer AFE1, AFE2 and AFE3 and at least one high-k dielectric layer HK1, HK2, HK3 and HK4. The multi-layer stack ML29 may further include a leakage blocking layer LBL and an interface control layer ICL.

The multi-layer stack ML29 may include a first high-k dielectric layer HK1, a first anti-ferroelectric layer AFE1, a second high-k dielectric layer HK2, a second anti-ferroelectric layer AFE2, a third high-k dielectric layer HK3, a third anti-ferroelectric layer AFE3, a fourth high-k dielectric layer HK4, a leakage blocking layer LBL, and an interface control layer ICL that are stacked in the mentioned order.

The first high-k dielectric layer HK1, the second high-k dielectric layer HK2, the third high-k dielectric layer HK3, and the fourth high-k dielectric layer HK4 may be the same material or different materials.

The first high-k dielectric layer HK1, the second high-k dielectric layer HK2, the third high-k dielectric layer HK3, and the fourth high-k dielectric layer HK4 may be made of or include hafnium oxide or zirconium oxide. The first high-k dielectric layer HK1, the second high-k dielectric layer HK2, the third high-k dielectric layer HK3, and the fourth high-k dielectric layer HK4 may be made of a single layer of hafnium oxide or a single layer of zirconium oxide. The first high-k dielectric layer HK1 and the fourth high-k dielectric layer HK4 may be thinner than each of the second high-k dielectric layer HK2 and the third high-k dielectric layer HK3. The first anti-ferroelectric layer AFE1, the second anti-ferroelectric layer AFE2, and the third anti-ferroelectric layer AFE3 may be thinner than each of the first and second high-k dielectric layers HK1 and HK2.

The first anti-ferroelectric layer AFE1, the second anti-ferroelectric layer AFE2, and the third anti-ferroelectric layer AFE3 may be made of or include-ferroelectric hafnium zirconium oxide AFE-HZO. The first high-k dielectric layer HK1 and the fourth high-k dielectric layer HK4 may include a thin zirconium oxide, and the second high-k dielectric layer HK2 and the third high-k dielectric layer HK3 may include a thick zirconium oxide. The leakage blocking layer LBL may be made of or include aluminum oxide ($Al_2O_3$), and the interface control layer ICL may be made of or include titanium oxide ($TiO_2$).

Referring to FIG. 26, the capacitor C30 may include a first electrode BE, a second electrode TE, and a multi-layer stack ML30 positioned between the first electrode BE and the second electrode TE. The multi-layer stack ML30 may include at least one anti-ferroelectric layer AFE1, AFE2, AFE3 and AFE4 and at least one high-k dielectric layer HK1, HK2, HK3, HK4 and HK5. The multi-layer stack ML30 may further include a leakage blocking layer LBL and an interface control layer ICL.

The multi-layer stack ML30 may include a first high-k dielectric layer HK1, a first anti-ferroelectric layer AFE1, a second high-k dielectric layer HK2, a second anti-ferroelectric layer AFE2, a third high-k dielectric layer HK3, a third anti-ferroelectric layer AFE3, a fourth high-k dielectric layer HK4, a fourth anti-ferroelectric layer AFE4, a fifth high-k dielectric layer HK5, a leakage blocking layer LBL, and an interface control layer ICL that are stacked in the mentioned order.

The first high-k dielectric layer HK1, the second high-k dielectric layer HK2, the third high-k dielectric layer HK3, the fourth high-k dielectric layer HK4, and the fifth high-k dielectric layer HK5 may be the same material or different materials.

The first high-k dielectric layer HK1, the second high-k dielectric layer HK2, the third high-k dielectric layer HK3, the fourth high-k dielectric layer HK4, and the fifth high-k dielectric layer HK5 may be made of or include hafnium oxide or zirconium oxide. Each of the first high-k dielectric layer HK1, the second high-k dielectric layer HK2, the third high-k dielectric layer HK3, the fourth high-k dielectric layer HK4, and the fifth high-k dielectric layer HK5 may be made of a single layer of hafnium oxide or a single layer of zirconium oxide. The first high-k dielectric layer HK1, the second high-k dielectric layer HK2, the third high-k dielectric layer HK3, the fourth high-k dielectric layer HK4, and the fifth high-k dielectric layer HK5 may have the same thickness. The first anti-ferroelectric layer AFE1, the second anti-ferroelectric layer AFE2, the third anti-ferroelectric layer AFE3, and the fourth anti-ferroelectric layer AFE4 may be thinner than each of the first to fifth high-k dielectric layers HK1 to HK5.

The first anti-ferroelectric layer AFE1, the second anti-ferroelectric layer AFE2, the third anti-ferroelectric layer AFE3, and the fourth anti-ferroelectric layer AFE4 may include an anti-ferroelectric hafnium zirconium oxide AFE-HZO. The first to fifth high-k dielectric layers HK1 to HK5 may include a thin zirconium oxide. The leakage blocking layer LBL may be made of or include aluminum oxide ($Al_2O_3$), and the interface control layer ICL may be made of or include titanium oxide ($TiO_2$).

Referring to FIG. 27, the capacitor C31 may include a first electrode BE, a second electrode TE, and a multi-layer stack ML31 between the first electrode BE and the second electrode TE. The multi-layer stack ML31 may include at least one anti-ferroelectric layer AFE1, AFE2, AFE3 and AFE4 and at least one high-k dielectric layer HK1, HK2, HK3, HK4, HK5 and HK6. The multi-layer stack ML31 may further include a leakage blocking layer LBL and an interface control layer ICL.

The multi-layer stack ML31 may include a first multi-layer stack ML31A, a second multi-layer stack ML31B, and a high band gap layer HBG positioned between the first multi-layer stack ML31A and the second multi-layer stack ML31B. The first multi-layer stack ML31A may include a first high-k dielectric layer HK1, a first anti-ferroelectric layer AFE1, a second high-k dielectric layer HK2, a second anti-ferroelectric layer AFE2, and a third high-k dielectric layer HK3 that are stacked in the mentioned order. The second multi-layer stack ML31B may include a fourth high-k dielectric layer HK4, a third anti-ferroelectric layer AFE3, a fifth high-k dielectric layer HK5, a fourth anti-ferroelectric layer AFE4, and a sixth high-k dielectric layer HK6 that are stacked in the mentioned order.

In the first multi-layer stack ML31A, the second high-k dielectric layer HK2 may be thicker than each of the first and third high-k dielectric layers HK1 and HK3. The first high-k dielectric layer HK1, the first anti-ferroelectric layer AFE1, the second anti-ferroelectric layer AFE2, and the third high-k dielectric layer HK3 may have the same thickness.

In the second multi-layer stack ML31, the fifth high-k dielectric layer HK5 may be thicker than the fourth and sixth high-k dielectric layers HK4 and HK6. The fourth high-k dielectric layer HK4, the third anti-ferroelectric layer AFE3, the fourth anti-ferroelectric layer AFE4, and the sixth high-k dielectric layer HK6 may have the same thickness.

The first to sixth high-k dielectric layers HK1 to HK6 may be made of the same material or different materials. The first to sixth high-k dielectric layers HK1 to HK6 may be made of or include hafnium oxide or zirconium oxide. The first to sixth high-k dielectric layers HK1 to HK6 may be made of a single layer of hafnium oxide or a single layer of zirconium oxide.

The first anti-ferroelectric layer AFE1, the second anti-ferroelectric layer AFE2, the third anti-ferroelectric layer AFE3, and the fourth anti-ferroelectric layer AFE4 may be made of or include-ferroelectric hafnium zirconium oxide AFE-HZO.

The leakage blocking layer LBL may be made of or include aluminum oxide ($Al_2O_3$), and the interface control layer ICL may be made of or include titanium oxide ($TiO_2$). The high band gap layer HBG may be made of or include aluminum oxide ($Al_2O_3$) or aluminum-doped zirconium oxide (Al-doped $ZrO_2$).

The multi-layer stack 603 of FIGS. 23A to 23F may include one multi-layer stack among the multi-layer stacks ML29 to ML31 of FIGS. 25 to 27.

According to the embodiment of the present invention, since a dielectric layer of a capacitor includes at least one anti-ferroelectric layer and at least one high-k dielectric layer, the capacitance of the capacitor may be increased.

Since the booster layer amplifies the dielectric constant, the capacitance of the capacitor may be further increased.

While the present invention has been described with respect to specific embodiments, it may be apparent to those skilled in the art that various changes and modifications may be made without departing from the spirit and scope of the invention as defined in the following claims.

What is claimed is:
1. A semiconductor device comprising:
a capacitor, wherein the capacitor includes:
a first electrode;
a second electrode; and
a high band gap layer disposed between the first electrode and the second electrode;
a first high-k dielectric layer disposed between the first electrode and the high band gap layer;
a first anti-ferroelectric layer disposed between the high band gap layer over the first high-k dielectric layer;

a second high-k dielectric layer disposed between the second electrode and the high band gap layer; and a second anti-ferroelectric layer disposed between the high band gap layer and the second high-k dielectric layer, wherein the first and second anti-ferroelectric layers have a tetragonal crystal structure, wherein the first and second anti-ferroelectric layers include a hafnium oxide-rich hafnium zirconium oxide whose hafnium oxide content is greater than a zirconium oxide content, wherein the high band gap layer is formed of a single layer of an aluminum-containing material and is directly contacted with the first and second anti-ferroelectric layers, and wherein the first and second high-k dielectric layers include zirconium oxide.

2. The semiconductor device of claim 1, wherein the first and second anti-ferroelectric layers include an anti-ferroelectric hafnium zirconium oxide.

3. The semiconductor device of claim 1, wherein the first and second anti-ferroelectric layers have a thickness which is thinner than approximately 30 Å.

4. The semiconductor device of claim 1, wherein the hafnium oxide-rich hafnium zirconium oxide has a thickness which is thinner than approximately 30 Å.

5. The semiconductor device of claim 1, wherein the high band gap layer has an energy band gap greater than the first and second anti-ferroelectric layers and the first and second high-k dielectric layers.

6. The semiconductor device of claim 1, further includes:
a leakage blocking layer between the second high-k dielectric layer and the second electrode; and
an interface control layer over the leakage blocking layer.

7. The semiconductor device of claim 6, wherein the leakage blocking layer includes a material having a lower dielectric constant and a higher energy band gap than the first and second anti-ferroelectric layers and the first and second high-k dielectric layers.

8. The semiconductor device of claim 6, wherein the interface control layer includes a material having a greater electronegativity than the first and second anti-ferroelectric layers and the first and second high-k dielectric layers.

9. The semiconductor device of claim 1, further comprising:
a semiconductor substrate;
a transistor including a buried word line structure formed in the semiconductor substrate, and a first source/drain region and a second source/drain region on both sides of the buried word line structure; and
a bit line coupled to the first source/drain region of the transistor,
wherein the first electrode is coupled to the second source/drain region of the transistor.

10. The semiconductor device of claim 1, wherein the first and second high-k dielectric layers have a tetragonal crystal structure.

11. The semiconductor device of claim 1, wherein the high band gap layer includes aluminum oxide, aluminum-doped zirconium oxide or aluminum-doped hafnium oxide.

* * * * *